US012604692B2

(12) United States Patent
Shaw et al.

(10) Patent No.: US 12,604,692 B2
(45) Date of Patent: Apr. 14, 2026

(54) PROCESS FOR MANUFACTURING ELECTROACOUSTIC MODULES

(71) Applicant: STMICROELECTRONICS S.r.l., Agrate Brianza (IT)

(72) Inventors: Mark Andrew Shaw, Milan (IT); Marco Del Sarto, Monza (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 693 days.

(21) Appl. No.: 17/866,257

(22) Filed: Jul. 15, 2022

(65) Prior Publication Data

US 2023/0028024 A1     Jan. 26, 2023

(30) Foreign Application Priority Data

Jul. 23, 2021     (IT) ........................ 102021000019718

(51) Int. Cl.
H01L 21/78 (2006.01)
H01L 21/308 (2006.01)
(Continued)

(52) U.S. Cl.
CPC ............ H01L 21/78 (2013.01); H01L 21/308 (2013.01); H01L 21/4857 (2013.01);
(Continued)

(58) Field of Classification Search
CPC ... H01L 21/78; H01L 21/308; H01L 21/4857; H01L 21/76898; H01L 24/94;
(Continued)

(56) References Cited

U.S. PATENT DOCUMENTS 5,260,913 A     11/1993   Kadota et al.
7,294,536 B2    11/2007   Villa et al.
(Continued)

FOREIGN PATENT DOCUMENTS

CN     101578703 A     11/2009
CN     103641060 A     3/2014
(Continued)

OTHER PUBLICATIONS

Lee, Hotaik et al., "Design of a Sparse Sub-array for Focused Ultrasound Surgery of Large Tumors," *IEEE International Ultrasonics Symposium Proceedings,* 2012, pp. 1165-1168.
(Continued)

*Primary Examiner* — Eduardo A Rodela
(74) *Attorney, Agent, or Firm* — Seed IP Law Group LLP

(57)     ABSTRACT

A process for manufacturing electroacoustic modules including: forming an assembly with a redistribution structure and a plurality of dice arranged in a dielectric region; forming a wafer with a semiconductor body and a plurality of respective unit portions laterally staggered, each of which includes a respective supporting region, set in contact with the semiconductor body, and a number of actuators; reducing the thickness of the semiconductor body and then selectively removing portions of the semiconductor body so as to singulate, starting from the wafer, a plurality of transduction structures, each including a semiconductor substrate, which contacts a corresponding supporting region and is traversed by cavities delimited by portions of the supporting region that form membranes mechanically coupled to the actuators; and then coupling the transduction structures to the redistribution structure of the assembly.

19 Claims, 18 Drawing Sheets

(51) Int. Cl.

| | |
|---|---|
| *H01L 21/48* | (2006.01) |
| *H01L 21/768* | (2006.01) |
| *H01L 23/00* | (2006.01) |
| *H10F 39/00* | (2025.01) |
| *B06B 1/02* | (2006.01) |
| *B81C 1/00* | (2006.01) |
| *H04R 19/00* | (2006.01) |

(52) U.S. Cl.
CPC ........ *H01L 21/76898* (2013.01); *H01L 24/94* (2013.01); *H10F 39/811* (2025.01); *B06B 1/0292* (2013.01); *B81B 2201/0242* (2013.01); *B81B 2201/0257* (2013.01); *B81B 2201/0271* (2013.01); *B81C 1/00182* (2013.01); *H01L 2224/13024* (2013.01); *H01L 2924/3511* (2013.01); *H04R 19/005* (2013.01)

(58) Field of Classification Search
CPC ... H01L 2224/13024; H01L 2924/3511; H10F 39/811; B06B 1/0292; B81B 2201/0242; B81B 2201/0257; B81B 2201/0271; B81B 7/007; B81B 7/008; B81C 1/00182; B81C 1/00238; B81C 1/0023; B81C 1/00261; H04R 19/005
See application file for complete search history.

(56) References Cited

U.S. PATENT DOCUMENTS

| | | | | |
|---|---|---|---|---|
| 8,105,875 | B1 * | 1/2012 | Hu | ................... H01L 23/49827 |
| | | | | 438/107 |
| 9,067,779 | B1 | 6/2015 | Rothberg et al. | |
| 9,969,614 | B2 * | 5/2018 | Yu | ....................... B81C 1/00269 |
| 11,383,971 | B2 * | 7/2022 | Quaglia | ............. B81C 1/00238 |
| 2008/0261345 | A1 | 10/2008 | Villa et al. | |
| 2010/0246862 | A1 | 9/2010 | Ihl et al. | |
| 2011/0084570 | A1 | 4/2011 | Soeda et al. | |
| 2011/0115333 | A1 | 5/2011 | Ezaki | |
| 2013/0115333 | A1 | 5/2013 | Crosato | |
| 2013/0285166 | A1 | 10/2013 | Classen | |
| 2013/0307096 | A1 | 11/2013 | Classen et al. | |
| 2014/0264660 | A1 | 9/2014 | Rothberg et al. | |
| 2015/0232329 | A1 | 8/2015 | Classen | |
| 2016/0009544 | A1 | 1/2016 | Rothberg et al. | |
| 2016/0009549 | A1 | 1/2016 | Rothberg et al. | |
| 2016/0057529 | A1 | 2/2016 | Kappus et al. | |
| 2017/0283254 | A1 | 10/2017 | Rothberg et al. | |
| 2017/0284882 | A1 | 10/2017 | Baldo et al. | |
| 2018/0369862 | A1 * | 12/2018 | Alie | ................... B81C 1/00246 |
| 2019/0123711 | A1 | 4/2019 | Revier et al. | |
| 2020/0024131 | A1 | 1/2020 | Quaglia et al. | |
| 2020/0156114 | A1 | 5/2020 | Gattere et al. | |
| 2022/0306456 | A1 | 9/2022 | Quaglia et al. | |
| 2024/0205611 | A1 | 6/2024 | Giusti et al. | |

FOREIGN PATENT DOCUMENTS

| | | | |
|---|---|---|---|
| CN | 104272190 | A | 1/2015 |
| CN | 205257992 | U | 5/2016 |
| CN | 105848080 | A | 8/2016 |
| CN | 106536067 | A | 3/2017 |
| CN | 108117035 | A | 6/2018 |
| DE | 102012208032 | A1 | 11/2013 |
| DE | 102017103747 | A1 | 8/2017 |
| EP | 3599217 | A1 | 1/2020 |
| WO | WO 2016102922 | A1 | 6/2016 |

OTHER PUBLICATIONS

Park, Byoungyoul et al., "A Lorentz Force Actuated Continuous Deformable Polymer Mirror for Wavefront Control," Proceedings, 1:554, 2017, 4 pages.

Liang et al., "Photodetectors based on two-dimensional semiconductors: Progress, opportunity and challenge," State Key Laboratory of Materials Processing and Die & Mould Technology, School of Materials Science and Engineering, Huazhong University of Science and Technology, China, 20 pages.

Kumar et al., "Robust TSV Via-Middle and Via-Reveal Process Integration Accomplished through Characterization and Management of Sources of Variation," IEEE, pp. 787-793, 2012.

Zhou et al., "Photoetching-based polyvinylidine flouride annular array transducer for photoacoustic endoscopy," Chinese Journal of Medical Physics, vol. 33, No. 7, Jul. 2016, 5 pages.

* cited by examiner

PROCESS FOR MANUFACTURING ELECTROACOUSTIC MODULES

BACKGROUND

Technical Field

The present disclosure relates to an improved process for manufacturing electroacoustic modules.

Description of the Related Art

As is known, numerous ultrasonic sensors are available today, which are designed to transmit and receive acoustic waves with frequencies higher than 20 kHz. Typically an ultrasonic sensor comprises, in addition to a transducer of an electroacoustic type, a circuitry designed to drive the transducer, as well as to amplify the electrical signals generated by the transducer itself following upon reception of acoustic echo signals. The transducer may include, for example, an actuator of a piezoelectric type that functions both as acoustic emitter and as acoustic receiver, in different periods of time.

If we denote as "acoustic stimulation signals" and "acoustic response signals," respectively, the acoustic signals (or beams) transmitted by the transducer and the acoustic signals (or beams) that impinge on the transducer, for example following upon reflection of the acoustic stimulation signals by an obstacle, it is known that, for example in the sonographic sector, there is the need to be able to focus the acoustic stimulation signals. In order to control emission in space of the acoustic stimulation signals, the technique is known that envisages providing a plurality of transducers, each of which emits spherical acoustic waves, and controlling such transducers with driving signals appropriately phase-shifted with respect to one another, so that the sum of the acoustic stimulation signals generated by the transducers will form an acoustic beam having the desired spatial distribution.

This being said, in order to increase the performance, in particular as regards amplification of the echo, it is necessary for the transducers, typically formed by corresponding MEMS (Micro-Electro-Mechanical Systems) devices, arranged in an array, to be arranged as close as possible to the electronic circuitry, and in particular to the part of electronic circuitry having the task of amplifying the electrical signals generated by the transducers. For this reason, it is known to form so-called electroacoustic modules that include precisely both the transducers and the electronic circuitry.

In practice, since each transducer is coupled to a respective application-specific integrated circuit (ASIC), which forms the driving circuit and the receiver associated to the transducer, it is necessary to manage thousands of connections present between the transducers and the ASICs connected thereto, controlling the delays introduced by the different channels (each channel being understood as being formed by a transducer, the corresponding driving circuit, and the corresponding receiver), as well as the jitter present between the different channels.

This being said, currently known are manufacturing processes that envisage machining a first semiconductor wafer and a second semiconductor wafer, so as to form, in the first wafer, a plurality of transducers, as well as to form, in the second wafer, a plurality of ASICs. Next, the first and second wafers are coupled together so that the transducers are coupled to the corresponding ASICs. This process, however, is characterized by a reduced flexibility, since it envisages adopting a single manufacturing technology both for the driving circuits and for the receiving circuits. In addition, this manufacturing process does not make it possible to test the ASICs, if not once the process itself is through.

To overcome the foregoing limitations, US 2020/0024131 describes a manufacturing method that envisages forming an assembly of dice, which have been previously singulated, i.e., separated, and include corresponding electronic circuits, so as to form a sort of reconstructed wafer, which moreover includes a redistribution region; the method then envisages coupling the reconstructed wafer to a wafer (known as MEMS wafer) including a single semiconductor body and a plurality of piezoelectric actuators, and then removing part of the semiconductor body, first by grinding and then by a selective etch of a dry type, so that the remaining semiconductor material will form a plurality of approximately undeformable substrates, each of which delimits a respective plurality of recesses, giving out onto which are corresponding membranes that carry the transducers. Moreover, the MEMS wafer comprises a plurality of conductive pillars, which are electrically coupled to the transducers; coupling between the MEMS wafer and the reconstructed wafer is obtained so that the conductive pillars are set in electrical contact with conductive pads of the redistribution region, which in turn are electrically connected to the integrated circuits formed in the dice of the reconstructed wafer. According to a variant, instead of the MEMS wafer, a plurality of semiconductor bodies is provided on a tape of adhesive material, each of which includes respective transducers and conductive pillars. The reconstructed wafer is then coupled to the ensemble formed by the semiconductor bodies and by the tape of adhesive material. The tape of adhesive material is then removed, and the gaps present between the semiconductor bodies are filled with an interstitial region formed by an epoxy resin. Next, part of the semiconductor material of the semiconductor bodies is removed so as to form the undeformable substrates; this operation envisages again carrying out grinding, followed by a selective etch of a dry type.

Unfortunately, practical implementation of the solutions proposed in US 2020/0024131 is problematical. In fact, the solution that envisages coupling the reconstructed wafer to the MEMS wafer is subject to the so-called warpage phenomenon, which can locally cause lack of formation of correct electrical contacts between some conductive pillars and the corresponding conductive pads of the redistribution region.

The solution that envisages coupling the ensemble formed by the semiconductor bodies and by the tape of adhesive material to the reconstructed wafer including the dice requires the interstitial region to be formed by a material that withstands in a satisfactory way the high temperatures that arise during the subsequent etching step. Unfortunately, so far materials that fully satisfy the above need are not available.

In addition, both of the solutions described in US 2020/0024131 envisage carrying out a dry etch on a stack including the reconstructed wafer and, alternatively, the MEMS wafer or else the ensemble formed by the plurality of semiconductor bodies and by the interstitial region; in both cases, the stack must be arranged on a so-called chuck and must be appropriately cooled so as to guarantee that the etch is uniform; however, the control of uniformity of the temperature in the stack is problematical.

BRIEF SUMMARY

The present disclosure provides at least one embodiment of a process for manufacturing MEMS devices that will overcome at least in part the drawbacks as discussed above.

In at least one embodiment, a process for manufacturing electroacoustic modules includes forming an assembly including a dielectric coating region; a plurality of unit portions laterally staggered with respect to one another, each of which includes at least one respective die, arranged in the dielectric coating region; and a redistribution structure electrically coupled to the dice, the dielectric coating region and the redistribution structure being arranged on top of one another; said process may further includes forming a wafer including a semiconductor body, having a thickness equal to an initial thickness, and a plurality of respective unit portions laterally staggered with respect to one another, each of which includes a respective supporting region, arranged in contact with the semiconductor body, and a number of respective actuators, which contact the supporting region; reducing the thickness of the semiconductor body of the wafer to a final thickness; and then selectively removing portions of the semiconductor body, so as to singulate, starting from the wafer, a plurality of transduction structures, each of which includes a respective semiconductor substrate, which contacts a corresponding supporting region (39) and is traversed by a number of respective cavities delimited by corresponding portions of the supporting region, which form corresponding membranes mechanically coupled to corresponding actuators; and then coupling the transduction structures to the redistribution structure of the assembly.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

The present process stems from an observation of the present applicant. In particular, the present applicant has noted how, considering an electroacoustic module, the mechanical modes of vibration of the corresponding semiconductor substrate, where the recesses onto which the membranes give out extend, have cutoff frequencies inversely proportional to the thickness of the semiconductor substrate. Consequently, in order to prevent the vibrations of the substrate induced by excitation of the membranes from interfering with operation of the electroacoustic module, it is expedient for the cutoff frequencies to be considerably higher (for example, by one order of magnitude) than the maximum frequency to which the membranes are sensitive (the latter, for example, being 10 MHz). Furthermore, a reduced thickness enables complete filling of the recesses with, for example, a silicone material, in order to improve transmission of the acoustic waves.

It is thus expedient for the overall thickness of the semiconductor substrate and of the membranes not to be greater, for example, than 50-micrometers ($\mu$m).

Figure 1:
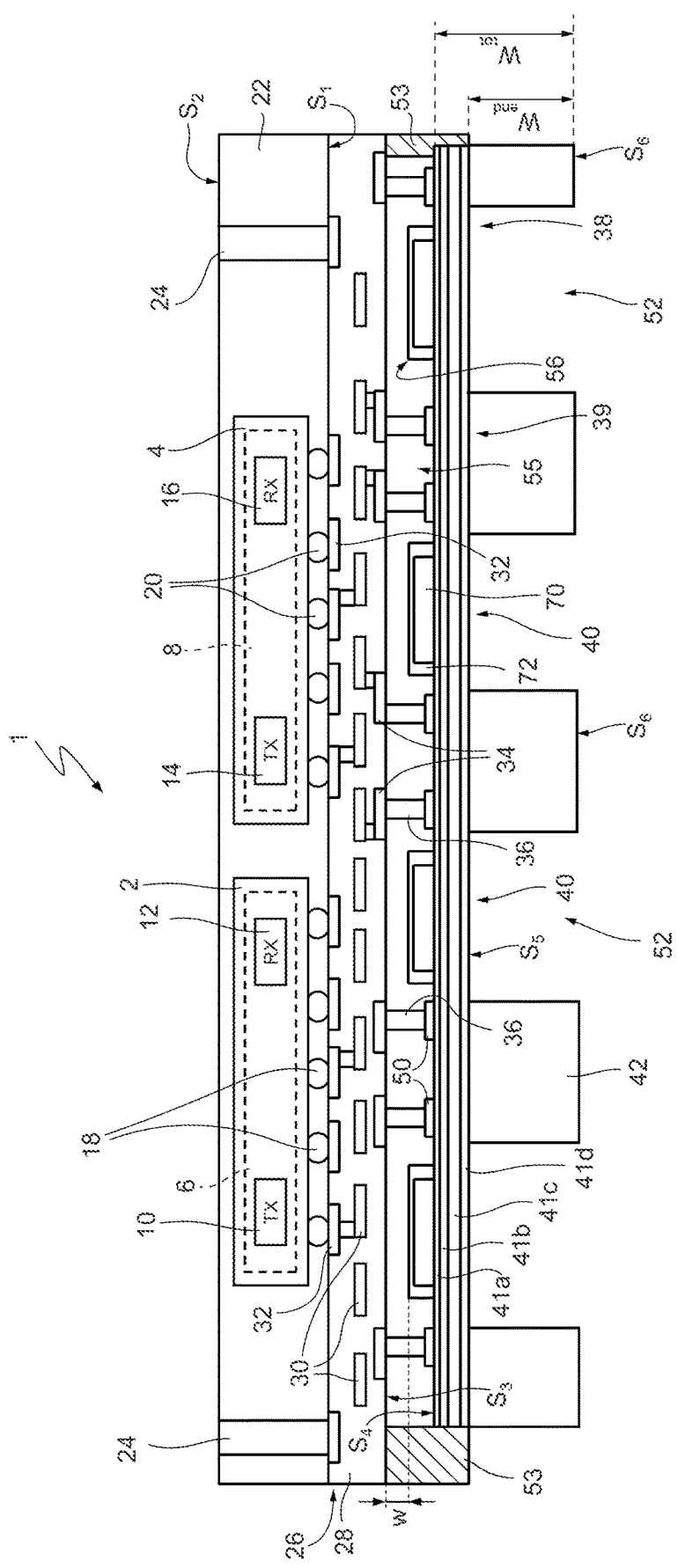
FIG. 1 is a schematic cross-sectional view of an electroacoustic module.

This being said, described in what follows is a process for manufacturing an electroacoustic module 1, shown in FIG. 1.

It should first be said that the electroacoustic module 1 comprises, purely by way of example, a first die 2 and a second die 4, formed inside which are, respectively, a first integrated circuit 6 and a second integrated circuit 8, constituted, for example, by ASICs of a known type. Each one of the first and second integrated circuits 6, 8 comprises a respective transmission circuit and a respective reception circuit, which are designated, respectively, by 10 and 12, in the case of the first integrated circuit 6, and by 14 and 16, in the case of the second integrated circuit 8.

Even though it is not shown in detail, in each one of the first and second integrated circuits 6, 8, the corresponding transmission and reception circuits are electrically connected to a corresponding plurality of metal bumps, designated, respectively, by 18 and 20 and also known as microbumps. Once again in a per se known manner, the bumps 18, 20 are electrically connected to the so-called last-level metallizations of the corresponding dice.

The electroacoustic module 1 further comprises a coating region 22, which is, for example, of an epoxy resin and englobes the first and second dice 2, 4, as well as part of the corresponding bumps 18, 20. The coating region 22 is delimited by a first surface $S_1$ and a second surface $S_2$. The bumps 18, 20 of the first and second dice 2, 4 give out onto the first surface $S_1$. In addition, extending through the coating region 22 is a plurality of vertical connection regions 24 of the type known as "through mold via" (TMV), each of which is of metal material and gives out onto both the first second surface $S_1$ and the second surface $S_2$.

The electroacoustic module 1 further comprises a redistribution structure 26, which comprises a dielectric region 28, a plurality of conductive paths 30 (shown qualitatively) and a plurality of inner pads 32 and outer pads 34.

The dielectric region 28 is, for example, of polyimide (or else, for example, polyamide, or a glass-fiber resin) and extends in contact with the first surface $S_1$. In addition to being delimited by the first surface $S_1$, the dielectric region 28 is delimited by a third surface $S_3$.

The inner pads 32 are of metal material (for example, copper and a barrier material, such as nickel) and give out onto the first surface $S_1$ so as to contact corresponding bumps 18, 20 of the first die 2 or the second die 4. The outer pads 34 are of metal material (for example, copper) and give out onto the third surface $S_3$. Furthermore, the conductive paths 30, for example, of copper, connect each inner pad 32 to a corresponding outer pad 34, or else to a portion that gives out onto the first surface $S_1$ of a corresponding vertical connection region 24. In this connection, the portions that give out onto the second surface $S_2$ of the vertical connection regions 24 are designed to be connected electrically to a PCB (Printed-Circuit Board), not shown.

The electroacoustic module 1 further comprises a plurality of pillars 36 of metal material, which extend from the third surface $S_3$, in a direction perpendicular to the first, second, and third surfaces $S_1$, $S_2$, $S_3$. For instance, each pillar 36 has an approximately cylindrical shape. Moreover, each pillar 36 contacts, at a respective first end, a corresponding outer pad 34.

The electroacoustic module 1 further comprises a structure 38, referred to in what follows as transduction structure 38.

The transduction structure 38 comprises a multilayer region 39, which is delimited by a fourth surface $S_4$, which faces, at a distance, the third surface $S_3$, and the fifth surface $S_5$.

By way of example, the multilayer region 39 comprises a passivation layer 41$a$, a first dielectric layer 41$b$, a semiconductor layer 41$c$, and a second dielectric layer 41$d$, which are now described with reference to the orientation assumed by the electroacoustic module 1 in FIG. 1. The passivation layer 41$a$, the first dielectric layer 41$b$, the semiconductor layer 41$c$, and the second dielectric layer 41$d$ may be referred to as a multilayer structure or region.

In detail, the passivation layer 41$a$ forms the fourth surface $S_4$ and is, for example, of silicon nitride. In addition, the first dielectric layer 41$b$ extends underneath the passivation layer 41$a$, with which it is in direct contact, and is, for example, of silicon oxide. The semiconductor layer 41$c$ extends underneath the first dielectric layer 41$b$, with which it is in direct contact. The second dielectric layer 41$d$ is, for example, of silicon oxide. Furthermore, the second dielectric layer 41$d$ extends underneath the semiconductor layer 41$c$, with which it is in direct contact, and forms the fifth surface $S_5$.

The transduction structure 38 further comprises a semiconductor substrate 42, which extends underneath the second dielectric layer 41$d$, with which it is in direct contact. Moreover, the semiconductor substrate 42 is delimited underneath by a sixth surface $S_6$ and laterally delimits a plurality of cavities 52 open downwards, which are moreover delimited at the top by corresponding portions of the second dielectric layer 41$d$.

In greater detail, each cavity 52 has, for example, a cylindrical shape. In addition, the portions of the multilayer region 39 that give out onto corresponding cavities 52 function as membranes (designated by 40), while the semiconductor substrate 42 functions as an (approximately) undeformable frame, to which the membranes 40 are fixed.

Without this implying any loss of generality, four membranes 40 are shown in FIG. 1. The semiconductor substrate 42 may, for example, have a rectangular envelope, in top view.

As mentioned previously, the thickness (designated by $W_{tot}$) of the ensemble formed by the multilayer region 39 and the semiconductor substrate 42 is not greater than 50 µm. Furthermore, the thickness of the multilayer region 39, and therefore also of the membranes 40, may be comprised, for example, between 5 µm and 7 µm, in which case the thickness of the semiconductor substrate 42 (designated by $W_{end}$) is comprised, for example, between 43 µm and 47 µm.

The transduction structure 38 further comprises a plurality of pads 50 of metal material (for example, formed by a region of AlCu and by an under-bump metallization formed by a stack of Ti, Cu, and Ni), referred to as drive pads 50. In this connection, for simplicity of representation, the drive pads 50 are shown as extending on the passivation layer 41$a$, even though at least part of each drive pad 50 may extend inside the passivation layer 41$a$.

Each drive pad 50 contacts a corresponding pillar 36. Consequently, each pillar 36 is interposed between a corresponding outer pad 34 and a corresponding drive pad 50.

The electroacoustic module 1 further comprises a sealing region 53, which is, for example, of benzocyclobutene (BCB) and extends between the multilayer region 39 and the dielectric region 28 of the redistribution structure 26 so as to delimit laterally a closed cavity 55, which is moreover delimited by the third and fourth surfaces $S_3$, $S_4$. The pillars 36 extend within the closed cavity 55. In addition, the sealing region 53 extends so as to surround laterally the multilayer region 39, in direct contact therewith.

The electroacoustic module 1 further comprises a plurality of actuators 56. By way of example, the electroacoustic module 1 comprises an actuator 56 for each membrane 40. Each actuator 56 extends, in the closed cavity 55, in contact with the corresponding membranes 40. In other words, each actuator 56 is carried by a corresponding membrane 40.

In greater detail, each actuator 56 comprises a respective piezoelectric region 70 and a respective protective region 72, as well as a pair of electrodes (not shown), electrically connected to corresponding drive pads 50. The protective region 72 overlies the piezoelectric region 70 and may be, for example, of the same material as that of the passivation layer 41$a$, with which it may form, for example, a single monolithic region, which englobes the piezoelectric region 70 and the corresponding electrodes. Furthermore, there is a distance w, for example comprised between 3 µm and 5 µm between the protective region 72 and the third surface $S_3$.

As mentioned previously, and without this implying any loss of generality, each actuator 56 is electrically coupled to a pair of drive pads 50, and is therefore electrically coupled to a pair of corresponding bumps of the first die 2 or the second die 4. In particular, this electrical coupling is obtained through corresponding pillars 36, as well as through corresponding outer pads 34, through corresponding conductive paths 30, and through corresponding inner pads 32. In this way, assuming, for example, that the actuator 56 is connected to the first die 2, it is able, in first time intervals, to receive electrical command signals generated by the transmission circuit 10 of the first die 2, which cause corresponding deformations of the membrane 40 mechanically coupled to the aforesaid actuator 56, with consequent generation of an acoustic wave. Moreover, in second time intervals, different from the first time intervals, deformation of the membrane 40, due (for example) to an acoustic echo signal impinging thereon, causes a corresponding deformation of the actuator 56, which generates an electrical response signal, which is received by the reception circuit 12 of the first die 2, which can process it and then supply a corresponding output signal to an external computer (not shown), through corresponding vertical connection regions 24.

In other words, in the present example, a part of the actuators 56, and therefore of the corresponding membranes 40, is electrically coupled to the first die 2, whereas another part of the actuators 56, and therefore of the corresponding membranes 40, is electrically coupled to the second die 4. Without this implying any loss of generality, each membrane 40 is connected both to the transmission circuit and to the reception circuit of the corresponding die.

All this being said, the electroacoustic module 1 can be manufactured according to the process described hereinafter.

Figure 2:
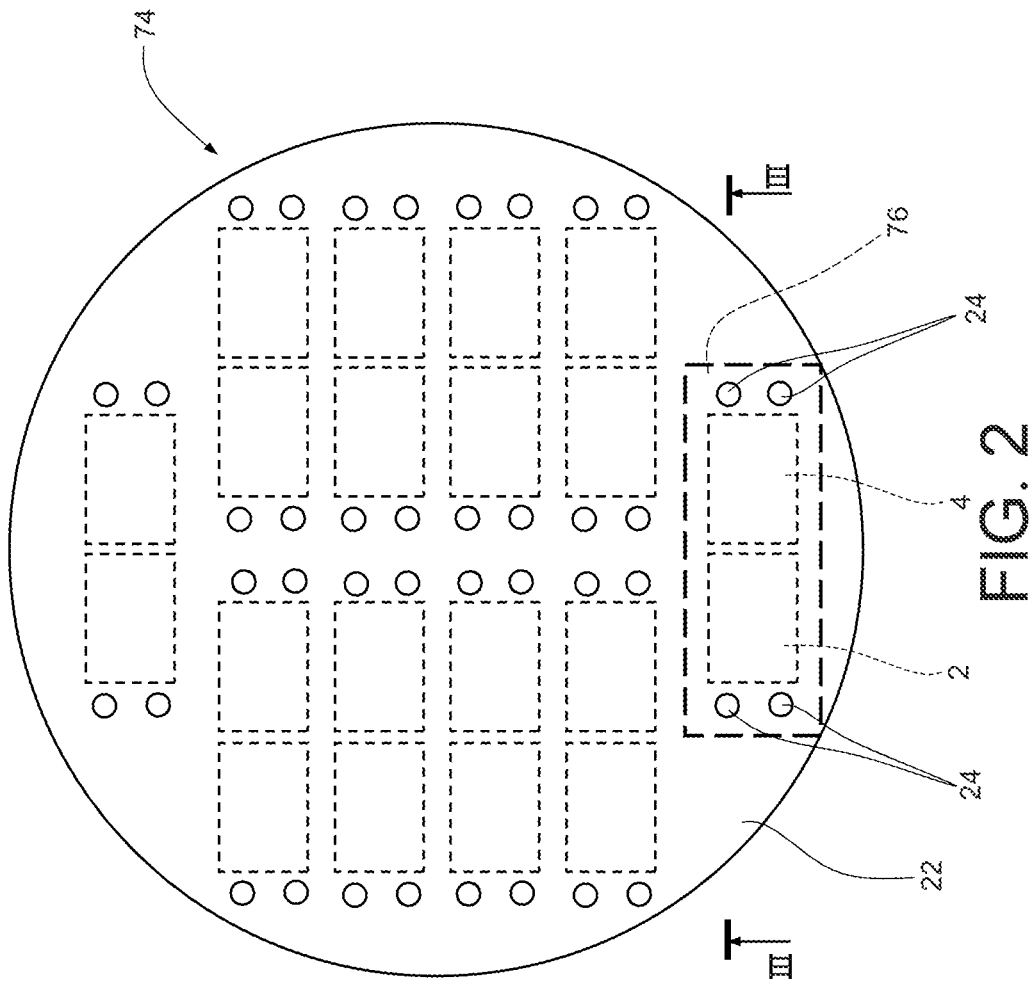
FIG. 2 is a schematic top view, with portions removed, of a reconstructed wafer.

As shown in FIG. 2, in a per se known manner an assembly 74 is formed, referred to hereinafter as the ASIC assembly 74.

The ASIC assembly 74 includes a plurality of unit portions 76, which are the same as one another and are laterally staggered (just one of them is highlighted, with a dashed line, in FIG. 2); the term "unit" refers precisely to the fact that these portions represent units (equivalently, basic portions) that are the same as one another and repeat in space. The plurality of unit portions 76 may be referred to as first unit portions.

Figure 3:
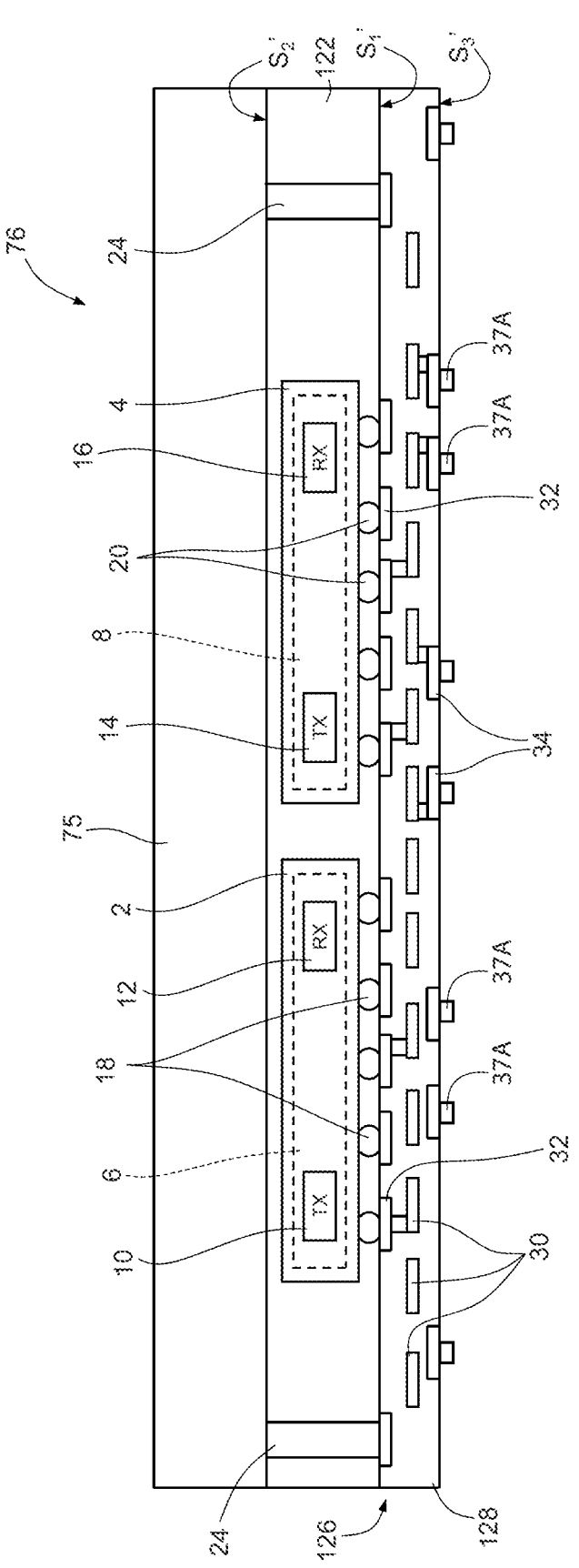
FIG. 3 is a schematic cross-sectional view of a portion of the reconstructed wafer shown in FIG. 2, taken along a line of section shown in FIG. 2.

In detail, a unit portion 76 is shown in FIG. 3 and is described in what follows, limitedly to the differences with respect to what is shown in FIG. 1. In addition, elements already shown in FIG. 1 are designated by the same reference numbers, except where otherwise specified.

In greater detail, the unit portion 76 is the same as the part of the electroacoustic module 1 that extends between the second and third surfaces $S_2$, $S_3$, as shown in FIG. 1, but for the differences highlighted hereinafter.

The coating region, here designated by 122, is shared between the unit portions 76 of the ASIC assembly 74; i.e., it forms a single region of the ASIC assembly 74. Also the dielectric region of the redistribution structure (here designated, respectively, by 128 and 126, and referred to hereinafter, respectively, as the assembly dielectric region 128 and the assembly redistribution structure 126) is shared between the unit portions 76 of the ASIC assembly 74. Furthermore, the first, second, and third surfaces are shared between the unit portions 76 of the ASIC assembly 74; i.e., they each represent, respectively, a portion of a first wafer surface $S_1'$, a second wafer surface $S_2'$, and a third wafer surface $S_3'$.

In addition, extending on the unit portion 76 is a support 75 (not shown in FIG. 2), for example of glass, which is shared between the unit portions 76 of the ASIC assembly 74. Moreover, extending underneath each outer pad 34, in direct contact, is a corresponding preliminary contact element 37A, which is of conductive material (for example, a stack of copper, nickel, and SnAgCu alloy). Furthermore, the preliminary contact elements 37A are designed to form corresponding pillars 36, as explained hereinafter. The preliminary contact elements 37A are formed, for example, by corresponding bumps, and therefore have approximately cylindrical shapes.

Without this implying any loss of generality, manufacture of the ASIC assembly 74 may be carried out in a per se known manner, by so-called machining techniques of a FOWLP (Fan-Out Wafer-Level Package) type. In this connection, the first and second dice 2, 4 of the unit portions 76 can be manufactured in a per se known manner, adopting so-called wafer-level manufacturing technologies, which enable manufacture, starting from a same semiconductor wafer (not shown), of a plurality of dice, and then singulation of said dice from one another by dicing operations. After a possible testing step, the dice thus formed are again mechanically coupled together, through coupling with the assembly redistribution structure 126 so as to form, precisely, the ASIC assembly 74.

In practice, the ASIC assembly 74 is formed by an assembly of dice fixed together, after being previously singulated, so that said assembly has to a first approximation the shape of a wafer, in the sense that it can be set on top of a semiconductor wafer appropriately machined, as described hereinafter. In other words, the ASIC assembly 74 represents a sort of reconstructed wafer. In addition, the dice of the ASIC assembly 74 share a single redistribution structure, formed precisely by the assembly redistribution structure 126.

The present manufacturing process moreover envisages machining of a wafer 80 of semiconductor material, shown in FIG. 4, referred to hereinafter as the MEMS wafer 80.

In detail, the MEMS wafer 80 comprises a semiconductor body 82, delimited by a respective first body surface $S_a$, which is designed to form the fifth surface $S_5$, and a respective second body surface $S_b$. The semiconductor body 82 has a thickness $W_{start}$ at least equal to, for example, 400 μm (for example, equal to 775 μm), so as to enable handling of the MEMS wafer 80 with present-day machinery, without risking damage to the MEMS wafer 80.

Figure 4:
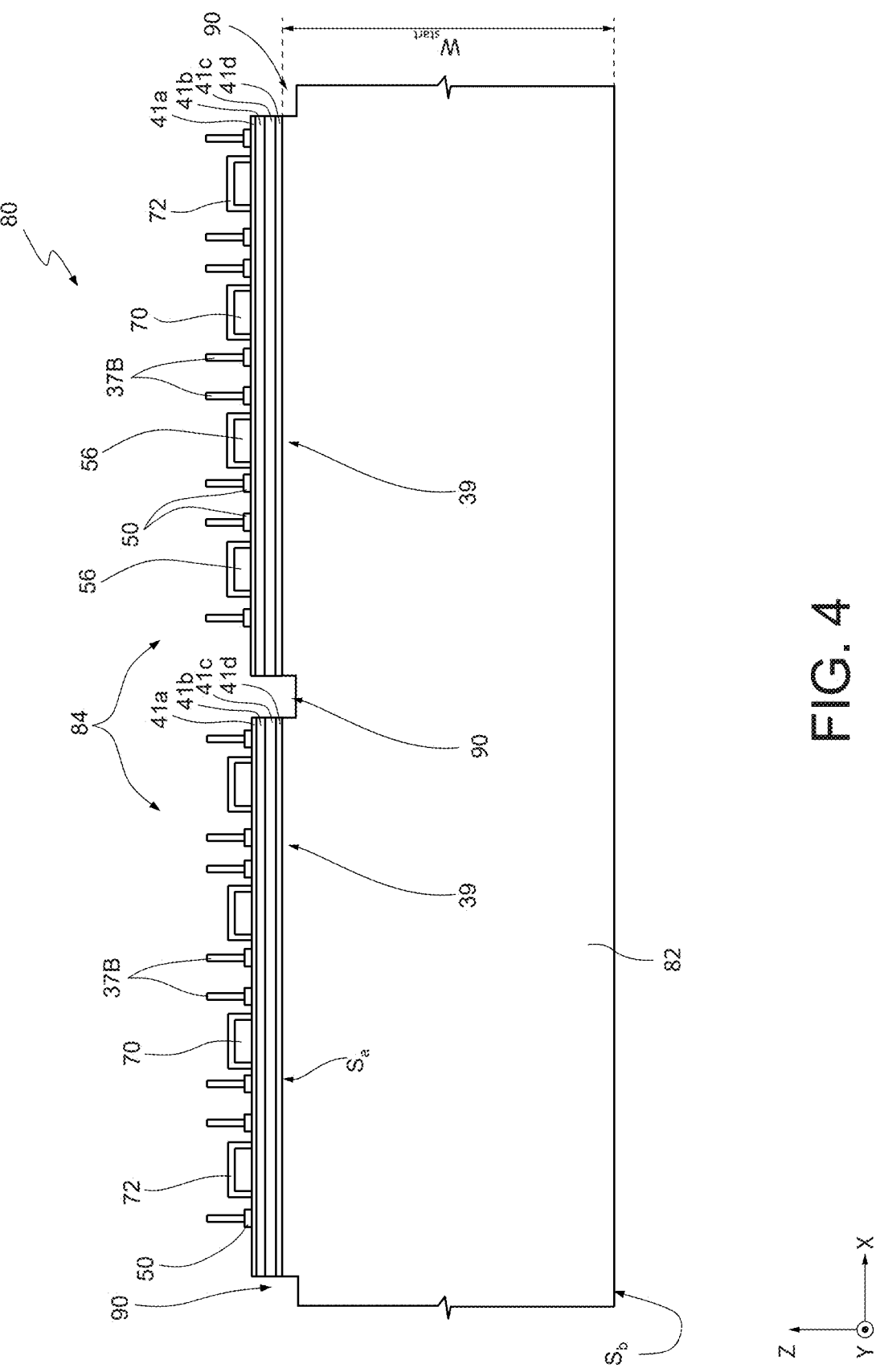
FIGS. 4-8 are schematic cross-sectional views of a semiconductor wafer during successive steps of the present manufacturing process.

With reference to the orientation assumed by the MEMS wafer 80 in FIG. 4, extending over the first body surface $S_a$ is a plurality of respective unit portions 84 (two of which are shown in FIG. 4), which are the same as one another. The plurality of respective unit portions 84 may be referred to as second unit portions.

Each unit portion 84 is the same as the transduction structure 38, except for the differences outlined hereinafter. In particular, the unit portion 84 is without the semiconductor substrate 42 and extends on the semiconductor body 82 so that the respective second dielectric layer 41d extends on the first body surface $S_a$. In addition, each unit portion 84 comprises a plurality of respective preliminary contact elements 37B, which overlie, in direct contact, corresponding drive pads 50 and are of conductive material (for example, a stack of copper, nickel, and gold). Furthermore, the preliminary contact elements 37B of the MEMS wafer 80 are formed, for example, by corresponding bumps, have approximately cylindrical shapes, and are designed to form, together with the preliminary contact elements 37A of the ASIC assembly 74, corresponding pillars 36, as explained hereinafter.

Assuming an orthogonal reference system XYZ with plane XY parallel to the first and second body surfaces $S_a$, $S_b$, the preliminary contact elements 37B extend up to a height, measured along the axis Z, greater than the height to which the protective regions 72 of the actuators 56 extend.

As may be seen once again in FIG. 4, the unit portions 84 are laterally staggered with respect to one another with respect to the underlying semiconductor body 82, so that the multilayer regions 39 of the unit portions 84 laterally delimit a cavity 90, referred to hereinafter as the wafer cavity 90. The wafer cavity 90 extends in part also inside the semiconductor body 82, underneath the first body surface $S_a$. The wafer cavity 90 may be referred to as a wafer recess.

Figure 5:
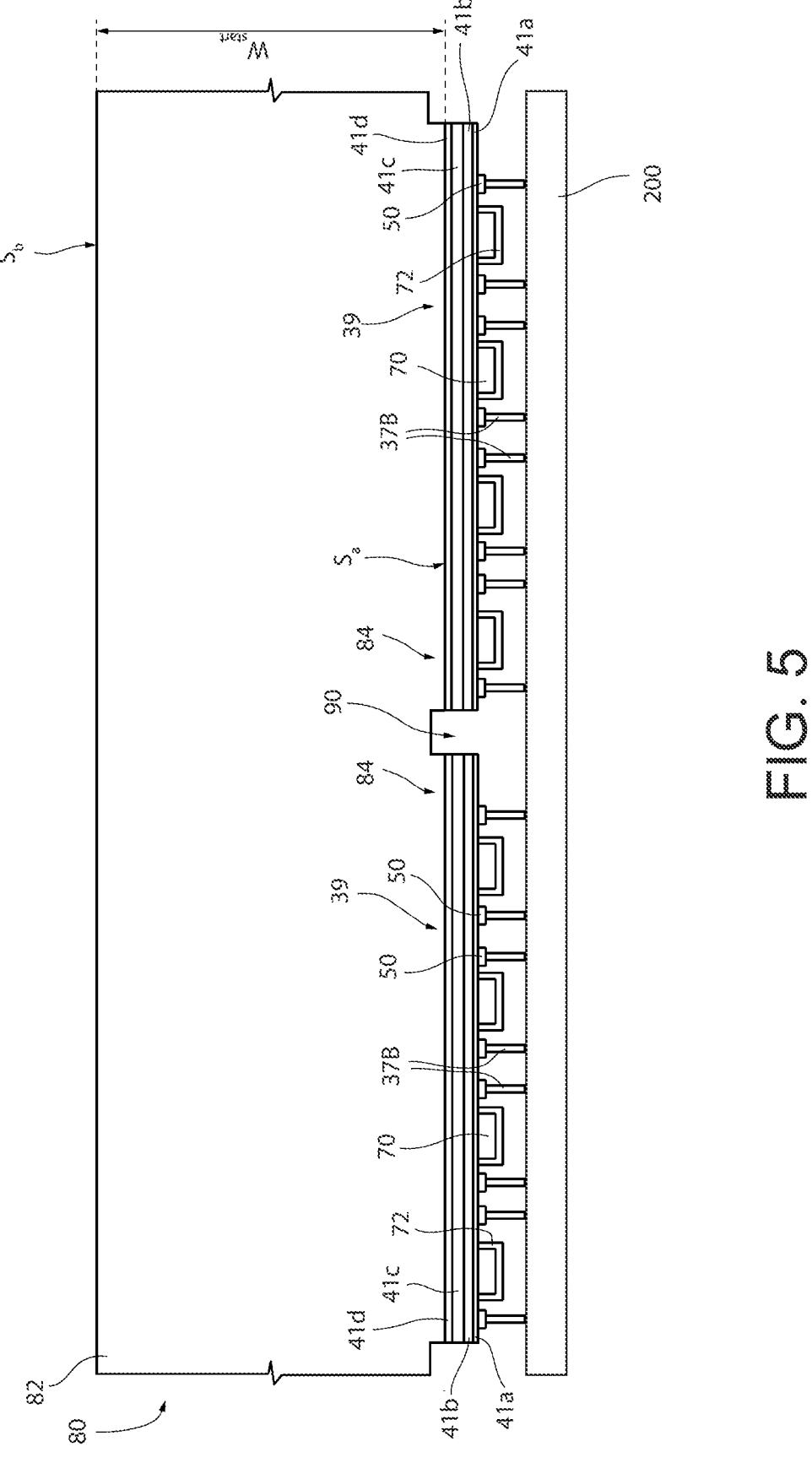

Next, as shown in FIG. 5, the MEMS wafer 80 is set on a support 200, formed, for example, by a first tape, with an orientation such that the first body surface $S_a$ faces the support 200. In particular, the preliminary contact elements 37B of the MEMS wafer 80 contact the support 200.

Figure 6:
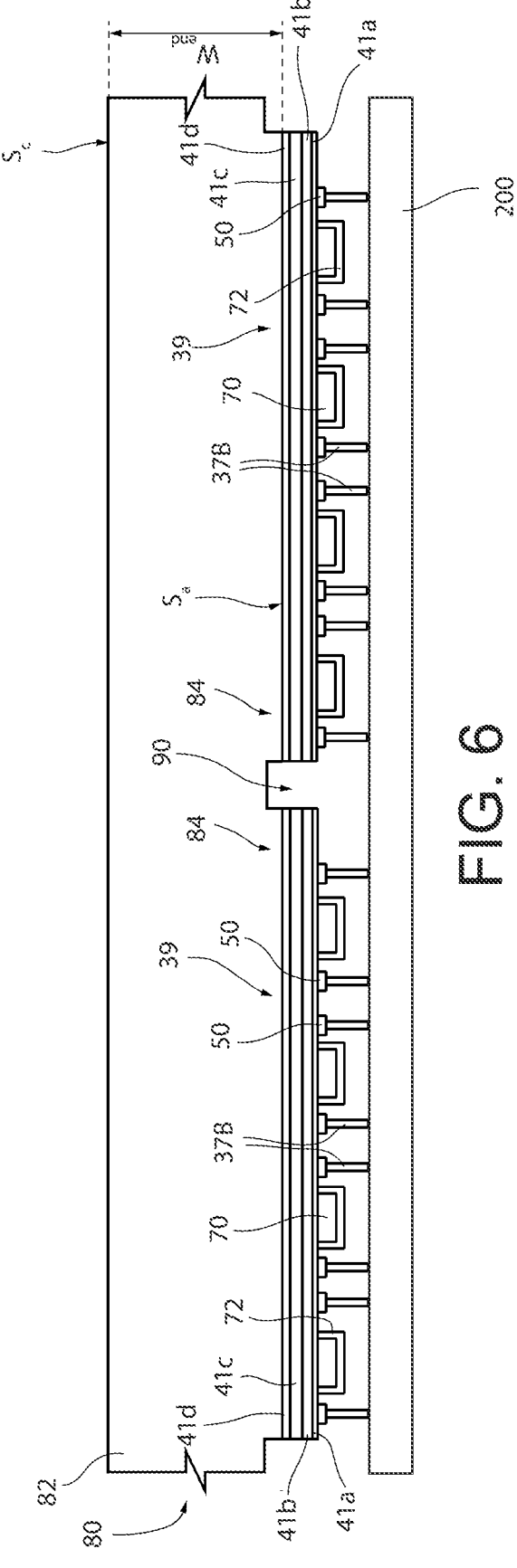

Then, as shown in FIG. 6, grinding of the semiconductor body 82 is carried out, starting from the second body surface $S_b$, so as to reduce the thickness thereof uniformly. In particular, at the end of grinding, the semiconductor body 82 has the aforementioned thickness $W_{end}$. Moreover, the semiconductor body 82 is delimited at the top by a third body surface $S_c$, which is to form the sixth surface $S_6$.

Figures 7, 8:
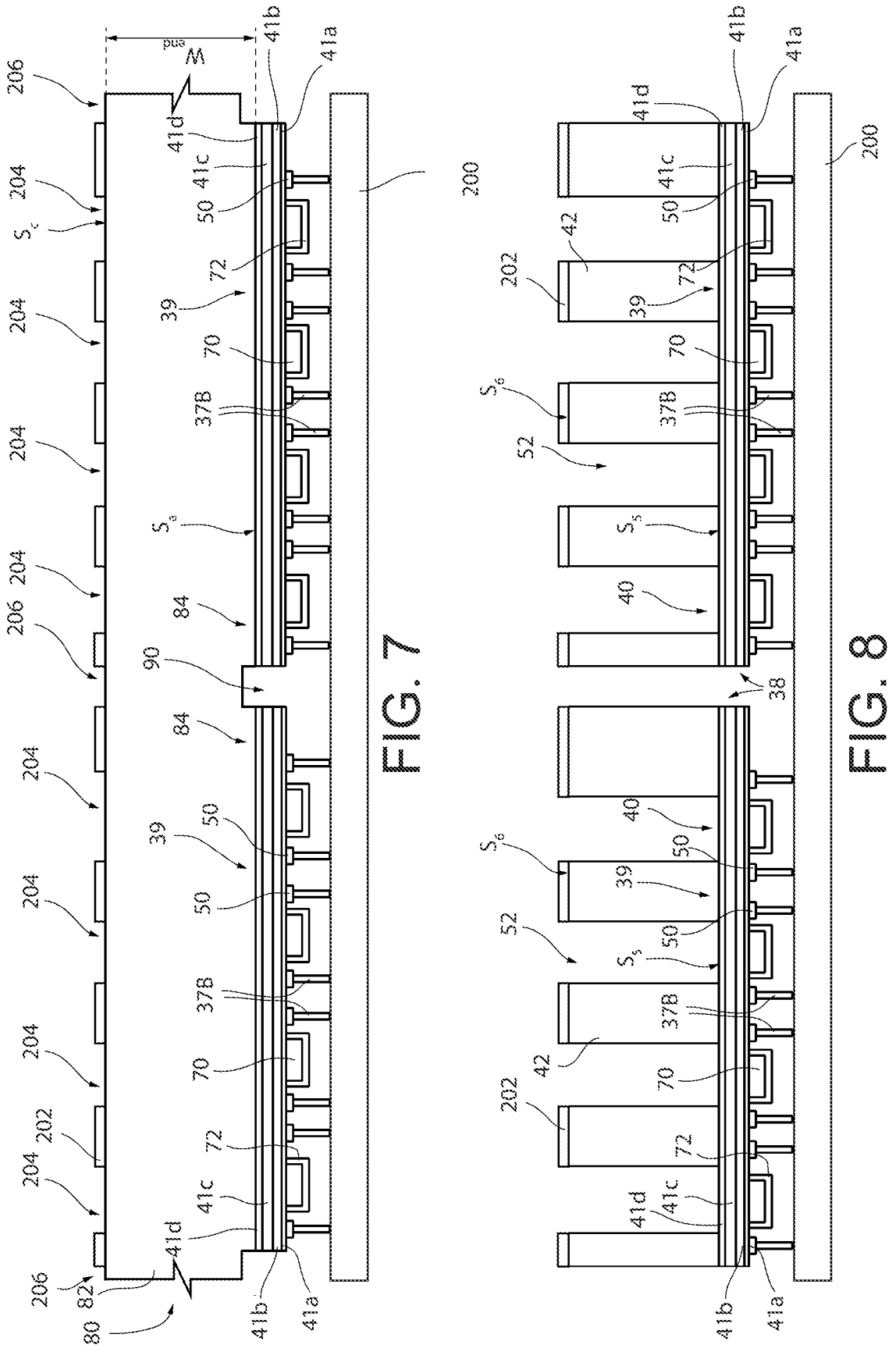

Then, as shown in FIG. 7, formed on the semiconductor body 82 is a photoresist mask 202, for example by photolithography or laser ablation. The mask 202 laterally delimits a plurality of first process openings 204, each of which overlies, at a distance, a corresponding actuator 56, as well as a second process opening 206, which overlies, at a distance, the wafer cavity 90.

Next, as shown in FIG. 8, through the mask 202 an etch of a dry type is carried out so as to remove selectively portions of the semiconductor body 82 that give out onto the first process openings 204 or onto the second process opening 206.

In particular, removal of the portions of the semiconductor body 82 that give out onto the first process openings 204 leads to exposure of the portions of the second dielectric layers 41d that are vertically aligned to the first process cavities 204 and, consequently, formation of the cavities 52, and release of the membranes 40. The cavities 52 may be referred to as recesses. In this connection, the second dielectric layers 41d function as stopper for the dry etch.

In addition, since the portion of the semiconductor body 82 that gives out onto the second process opening 206 is interposed between the wafer cavity 90 and the second process opening 206, its removal entails the singulation of the semiconductor body 82 into a plurality of semiconductor substrates 42 of corresponding transduction structures 38, which are traversed by the cavities 52. In practice, the MEMS wafer 80 is divided into a plurality of dice that form corresponding transduction structures 38, which are moreover coupled to corresponding preliminary contact elements 37B.

Next, in a per se known manner and consequently not shown, the mask 202 is removed, for example by a so-called plasma ashing process.

Figure 9:
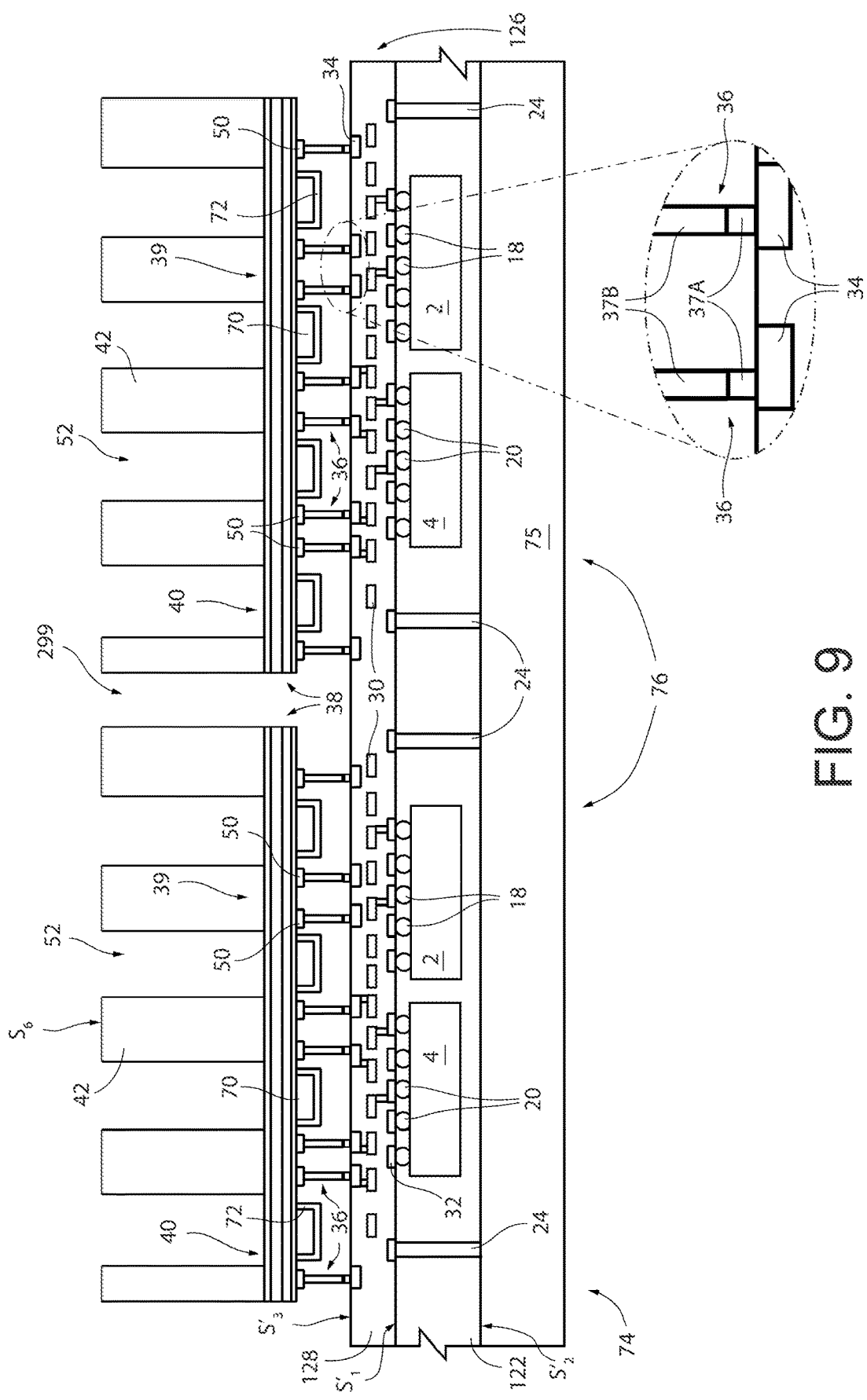
FIGS. 9-11 are schematic cross-sectional views of an assembly including a reconstructed wafer and transduction structures, during successive steps of the present manufacturing process.

Then, as shown in FIG. 9, the transduction structures 38 are removed from the support 200 and are mechanically and electrically coupled to the ASIC assembly 74.

In particular, each transduction structure 38 is coupled to a corresponding unit portion 76 of the ASIC assembly 74. A gap 299 separates the transduction structures 38 laterally. In particular, the gap 299 is laterally delimited by the semiconductor substrates 42 and by the multilayer regions 39 and gives out onto underlying portions of the third wafer surface $S_3'$ of the assembly redistribution structure 126.

In greater detail, in a per se known manner, each preliminary contact element 37B of the transduction structure 38 is soldered to a corresponding preliminary contact element 37A of a corresponding unit portion 76 of the ASIC assembly 74 so as to form a corresponding pillar 36, which may therefore be of different materials. In this connection, in FIG. 9 each pillar 36 is shown as being formed by the juxtaposition of the corresponding preliminary contact element 37B of the transduction structure 38 and of the corresponding preliminary contact element 37A of the corresponding unit portion 76, even though soldering may envisage coating with a solder paste (not shown) at least part of at least one of the aforementioned corresponding preliminary contact element 37B of the transduction structure 38 and the aforementioned preliminary contact element 37A of the corresponding unit portion 76. In the subsequent figures, the pillars 36 are, instead, shown as a whole.

In greater detail, to form the pillars 36 it is possible to implement techniques of temporary holding of the transduction structures 38 with respect to the ASIC assembly 74, and therefore fixing material may be used that then vaporizes during soldering. Moreover, soldering techniques without flux may be applied to prevent any possible contamination.

Figure 10:
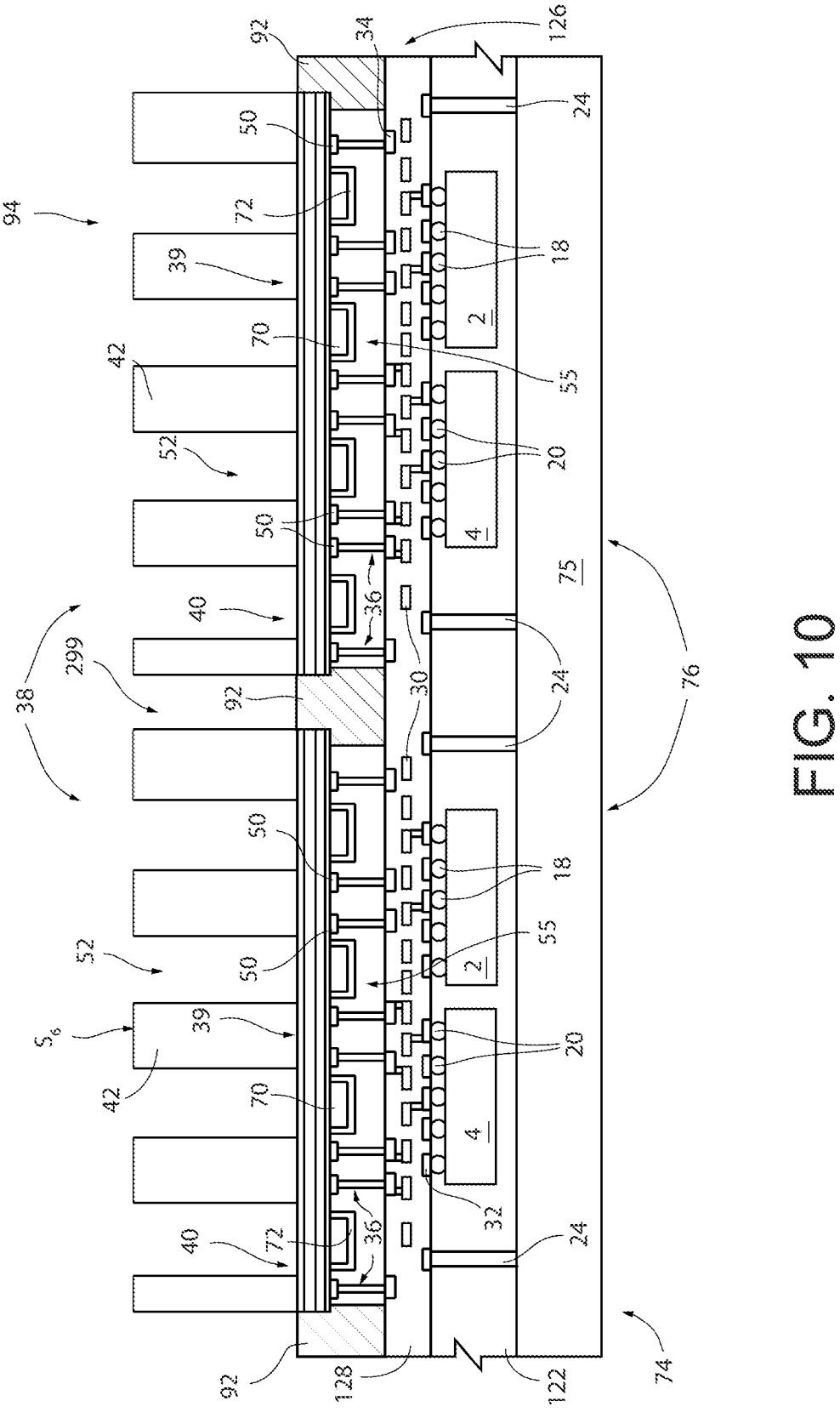

As shown in FIG. 10, after mechanical coupling, the gap 299 is at least partially filled with a bonding region 92, which is designed to form the sealing region 53 and is, for example, of BCB (benzocyclobutene). Variants are in any case possible in which the bonding region 92 is formed on the ASIC assembly 74 before coupling the transduction structures 38 to the ASIC assembly 74.

Without this implying any loss of generality, the bonding region 92 therefore extends in the part of gap 299 laterally delimited by the multilayer regions 39 until underlying portions of the assembly redistribution structure 126 are contacted so as to close laterally a corresponding closed cavity 55 for each transduction structure 38.

In practice, the ASIC assembly 74, the transduction structures 38, and the bonding region 92 form a multidie assembly 94.

Figure 11:
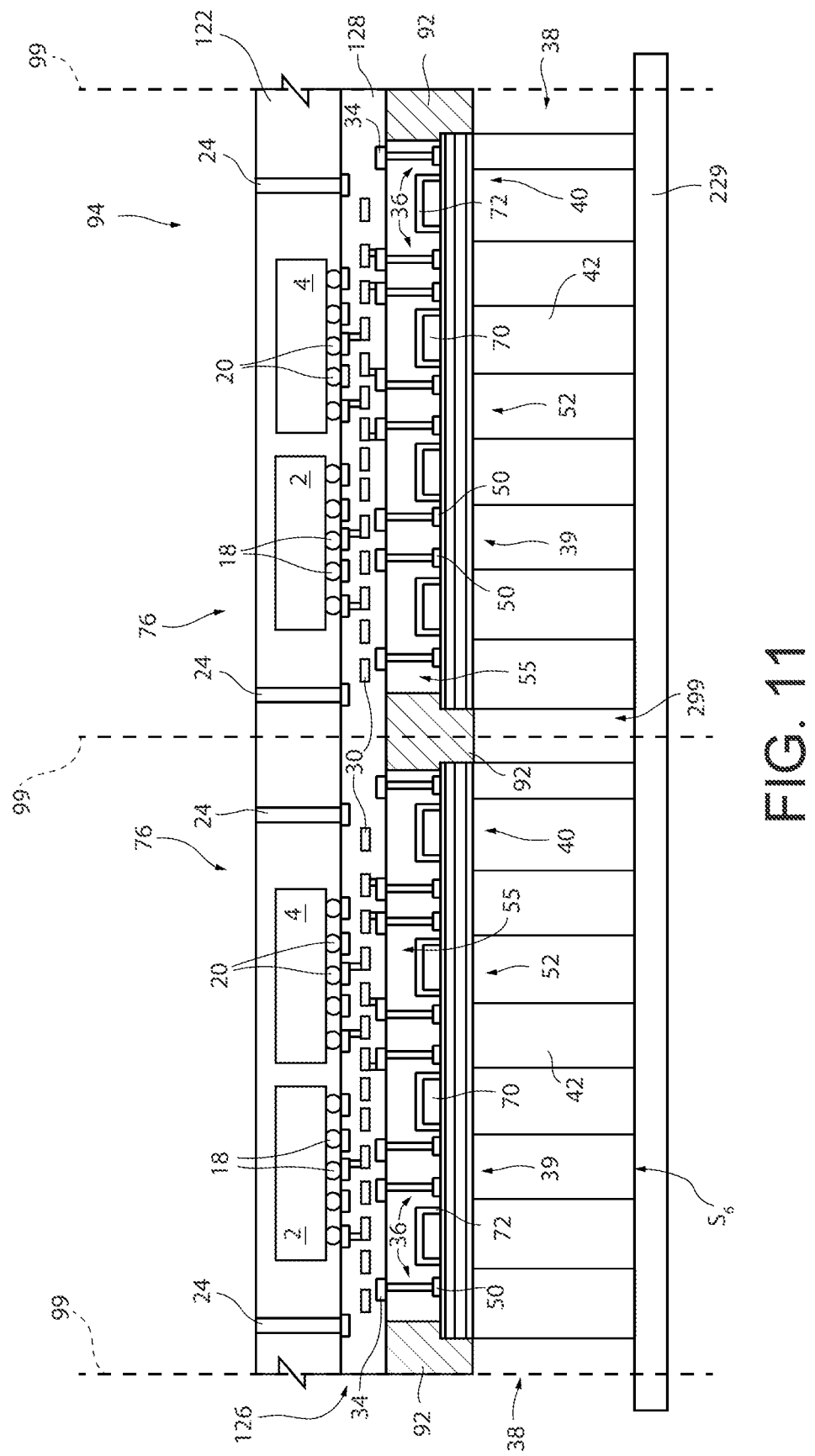

Next, as shown in FIG. 11, the support 75 of the ASIC assembly 74 is removed (possibly, removal can be carried out even before coupling of the transduction structures 38 to the ASIC assembly 74) and the multidie assembly 94 is turned over and arranged on a second tape 229. Then, a dicing operation is carried out along scribe lines 99 (indicated schematically dashed in FIG. 11) that traverse the bonding region 92, which entails singulation, starting from the multidie assembly 94, of a plurality of electroacoustic modules 1. The remaining portions of the bonding region 92 form the sealing regions 53.

Even though it is not shown or described in detail, before execution of the dicing operations, it is possible for further operations to be carried out, such as operations of ball attach on the vertical connection regions 24 of the ASIC assembly 74.

Figure 12:
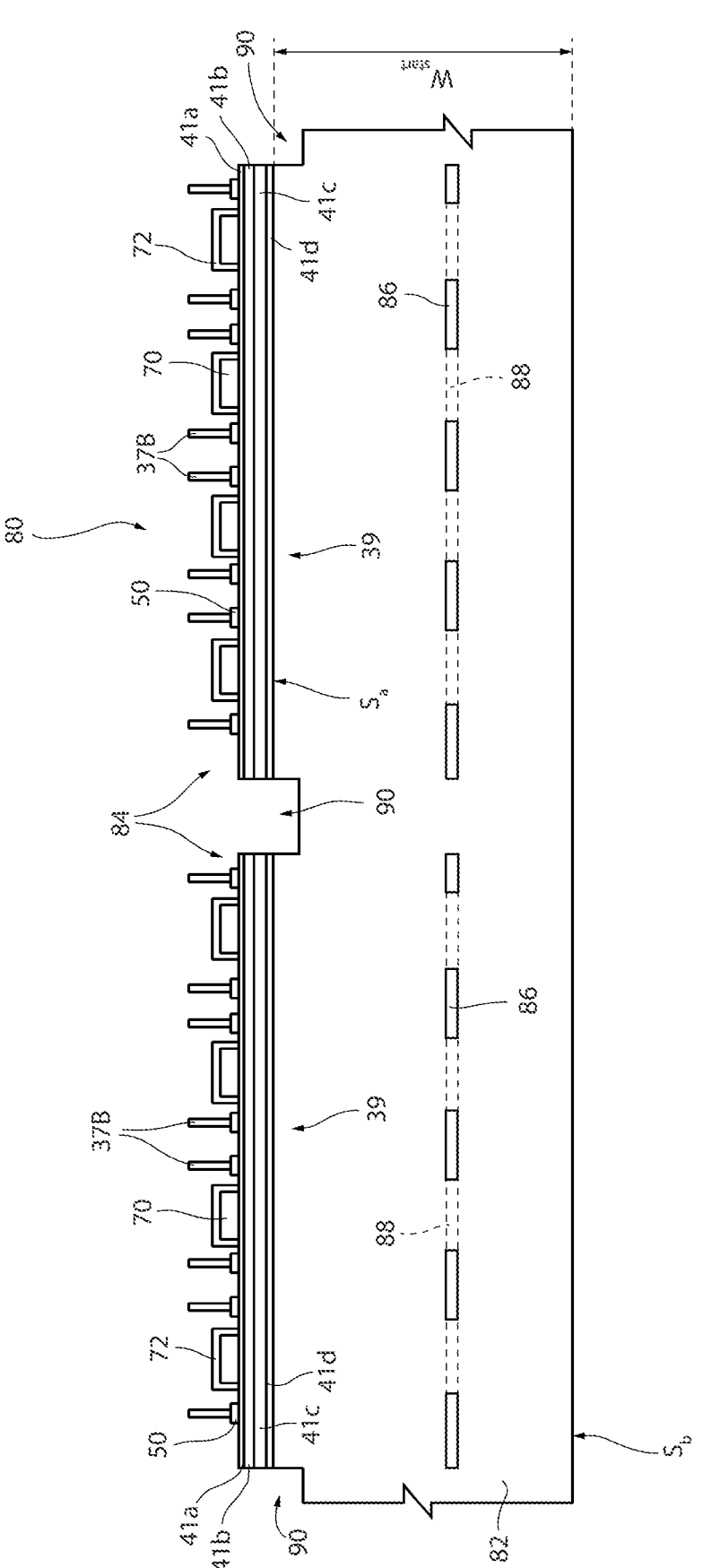
FIGS. 12-15 are schematic cross-sectional views of a semiconductor wafer during successive steps of a variant of the present manufacturing process.

According to a different embodiment, shown in FIG. 12, extending within the semiconductor body 82 of the MEMS wafer 80 is a plurality of buried dielectric regions 86, which are, for example, of silicon oxide and are coplanar. For instance, the MEMS wafer 80 may comprise a number of buried dielectric regions 86 equal to the number of unit portions 84, which extend at a distance from the first body surface $S_a$. Furthermore, each buried dielectric region 86 laterally delimits a number of portions 88 of the semiconductor body 82 (shown dashed in FIG. 12) equal to the number of membranes 40 of the electroacoustic module 1, which are referred to hereinafter as the filling portions 88. The buried dielectric regions 86 are moreover laterally staggered with respect to the overlying wafer cavity 90.

Figure 13:
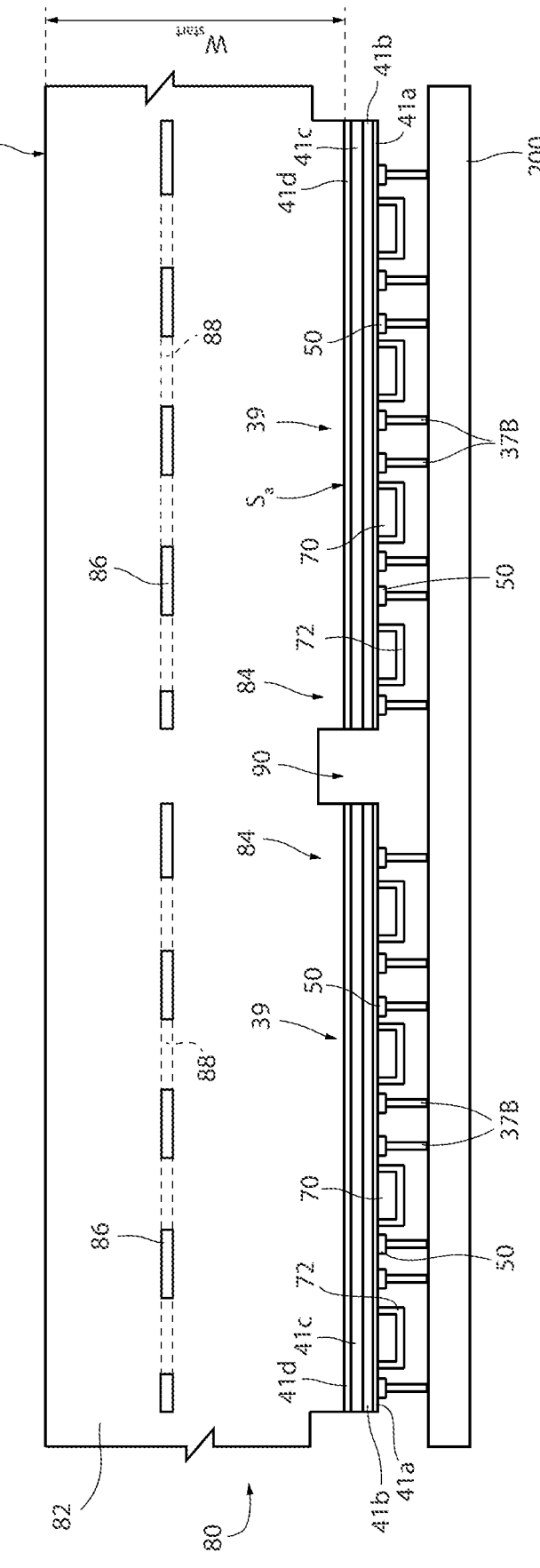

In this case, the manufacturing process envisages that, as shown in FIG. 13, the MEMS wafer 80 is arranged on the support 200 in the same way as described with reference to FIG. 5.

Figure 14:
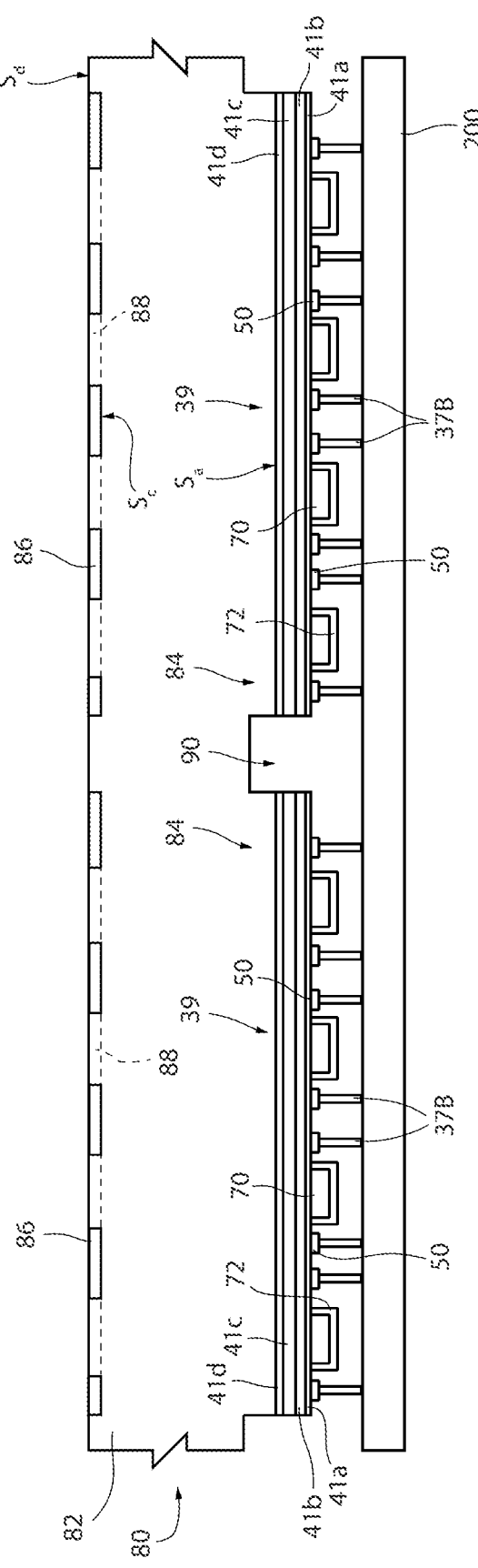

Then, as shown in FIG. 14, mechanical grinding of the semiconductor body 82 is carried out starting from the bottom surface $S_b$ so as to expose the buried dielectric regions 86.

The remaining portion of the semiconductor body 82 is now delimited by a fourth body surface $S_a$. The buried dielectric regions 86 and the filling portions 88 consequently give out onto the fourth body surface $S_a$.

Figure 15:
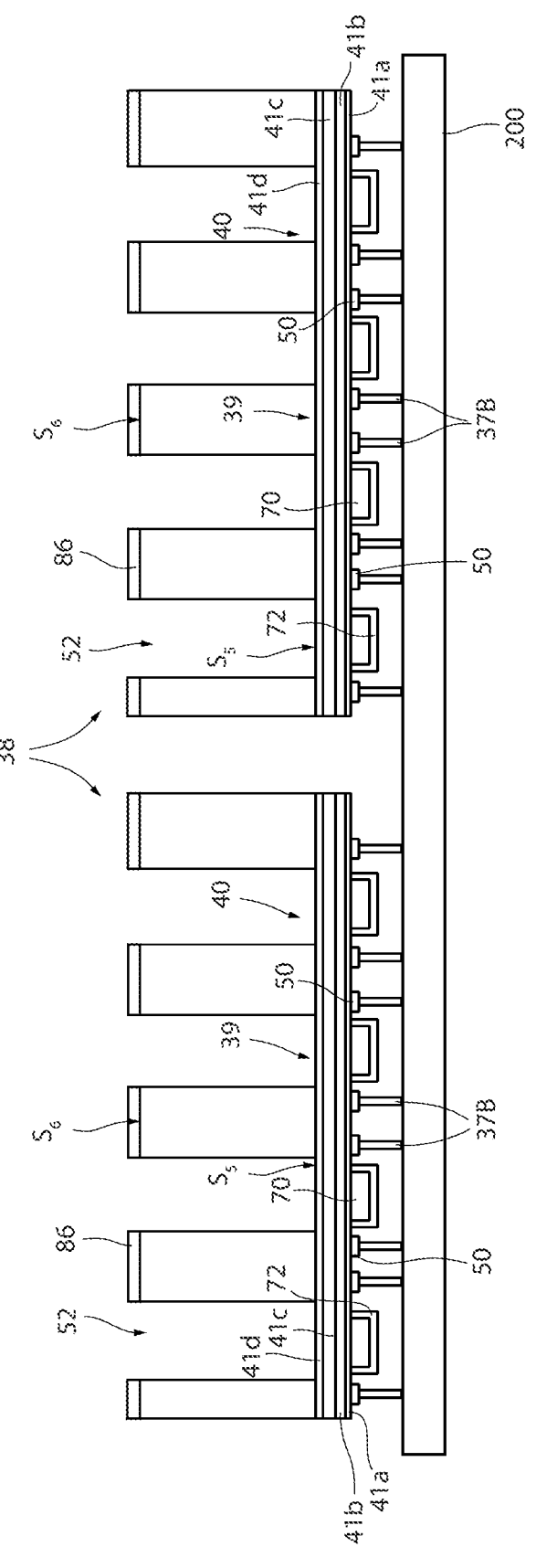

Next, as shown in FIG. 15, an etch is carried out, in which the buried dielectric regions 86, now exposed, function as hard mask. In this way, the filling portions 88 are selectively removed, in addition to underlying portions of the semiconductor body 82, until underlying portions of the second dielectric layers 41d of the transduction structures 38, which function as etch stoppers, are exposed. The cavities 52 are thus formed, and the membranes 40 are consequently released.

The portions of the semiconductor body 82 that are interposed between the buried dielectric regions 86 and overlie the wafer cavity 90 are moreover removed; this removal entails singulation of the semiconductor body 82 into a plurality of semiconductor substrates 42 of corresponding transduction structures 38, in the same way as described with reference to FIG. 8. The process then proceeds as described with reference to FIGS. 9-11.

Figure 16:
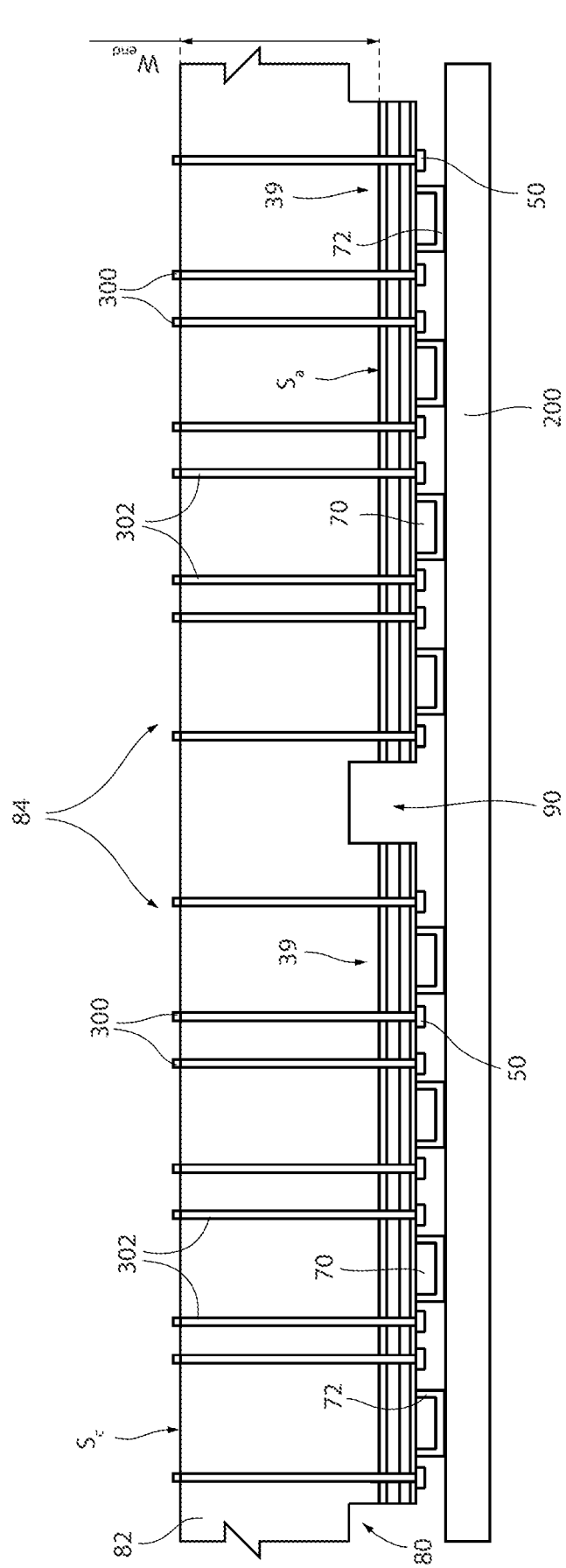
FIGS. 16-18 are schematic cross-sectional views of a semiconductor wafer during successive steps of a further variant of the present manufacturing process.

According to a further variant shown in FIG. 16, after the grinding described with reference to FIG. 6, the MEMS wafer 80 is machined so as to form, for each unit portion 84, a corresponding plurality of bumps 300, which extend over the third body surface $S_c$. In this case, the pillars 36 may be absent, and therefore the protective regions 72 can contact the support 200.

Moreover, each unit portion 84 comprises a plurality of respective vertical conductive connections of a TSV (Through-Silicon Vias) type, referred to as TSVs 302. Each TSV 302 electrically connects a corresponding drive pad 50 to a corresponding bump 300, and therefore extends both through the semiconductor body 82 and through the multilayer regions 39. The TSVs 302 therefore give out onto the third body surface $S_c$.

Figure 17:
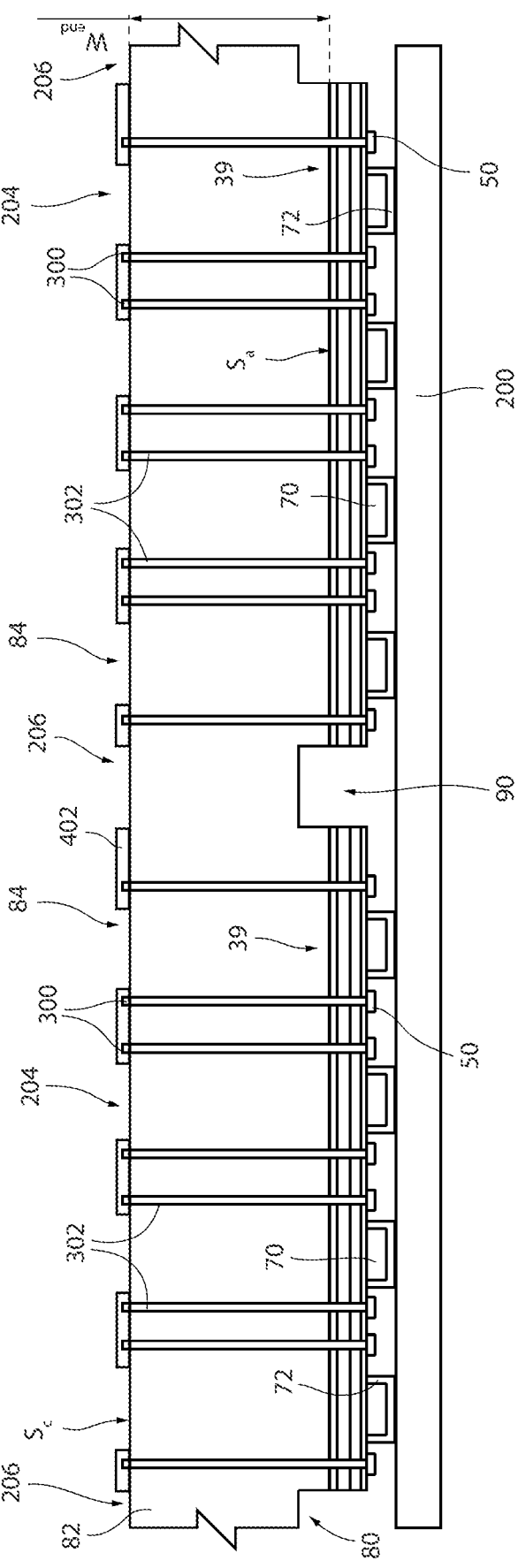

Then, as shown in FIG. 17, formed on the semiconductor body 82 (by deposition and photolithography/laser ablation) is the mask (here designated by 402), which again delimits the first process openings 204 and the second process opening 206 and moreover coats the bumps 300 entirely so as to protect them during the subsequent etch.

Figure 18:
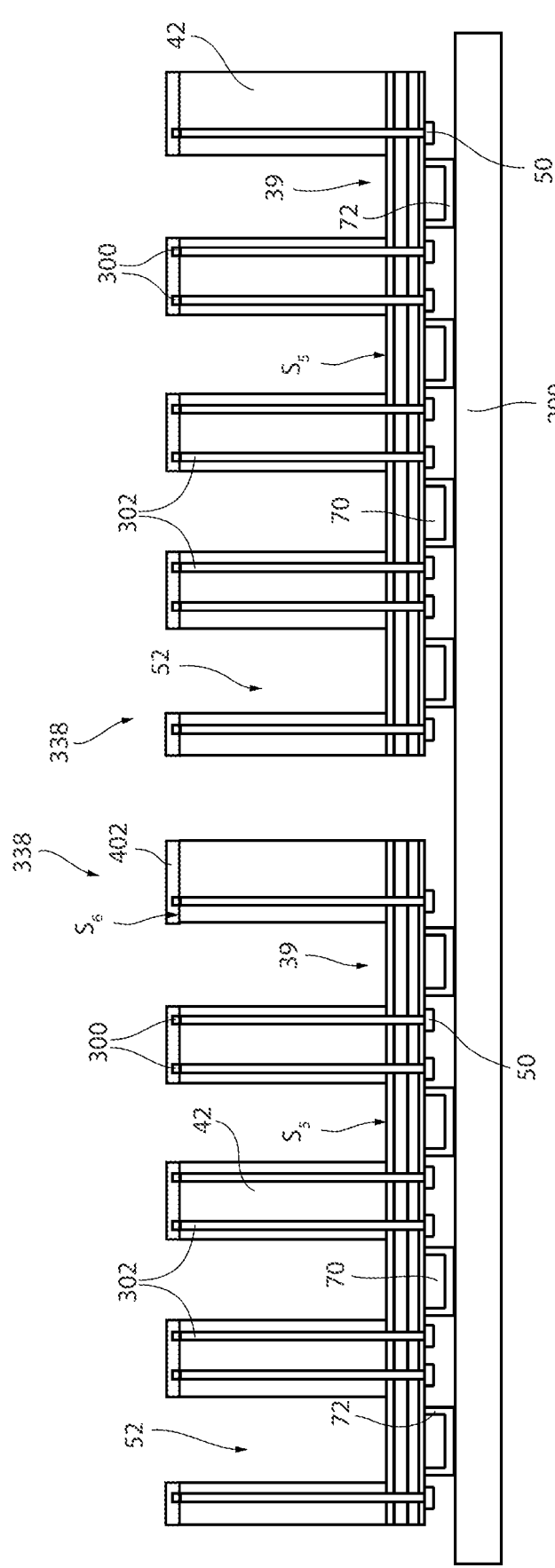

Then, as shown in FIG. 18, the process proceeds in the same way as described with reference to FIG. 8 so as to form the cavities 52, release the membranes 40, and singulate the transduction structures, here designated by 338. Next, the mask 402 is removed.

Figure 19:
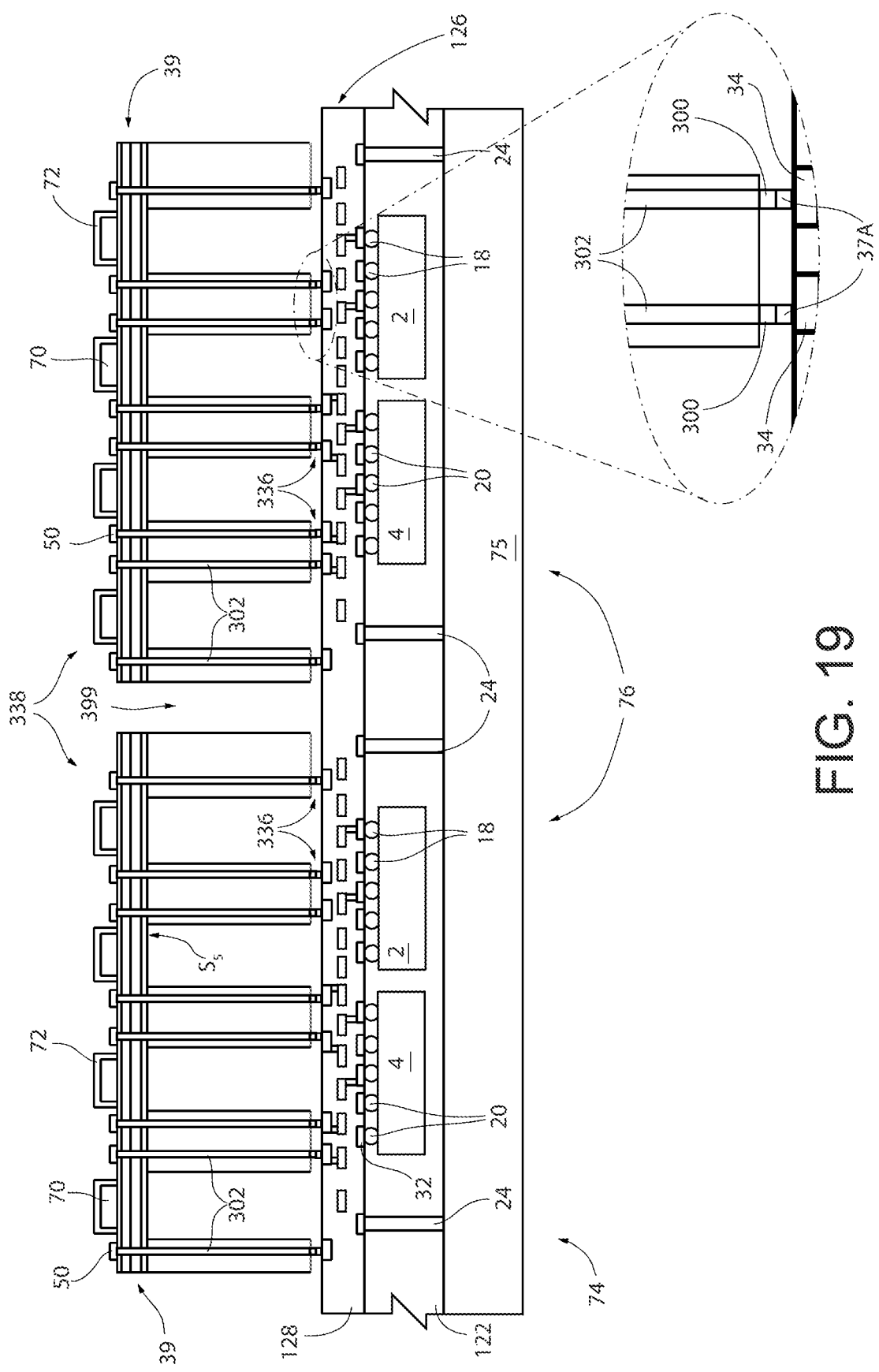
FIG. 19 is a schematic cross-sectional view of an assembly including a reconstructed wafer and transduction structures, during a step of the further variant of the present manufacturing process.

Then, as shown in FIG. 19, the transduction structures 338 are removed from the support 200 and are mechanically and electrically coupled to the ASIC assembly 74.

In particular, each transduction structure 338 is coupled to a corresponding unit portion 76 of the ASIC assembly 74; the gap (here designated by 399) separates the transduction structures 338 laterally.

With respect to what is shown in FIG. 9, the transduction structures 338 are turned upside down; i.e., they have the sixth surface $S_6$, on which the bumps 300 are arranged, facing the ASIC assembly 74.

In greater detail, each bump 300 of each transduction structure 338 is bonded to a corresponding preliminary contact element 37A of a corresponding unit portion 76 of the ASIC assembly 74 so as to form a corresponding pillar, here designated by 336, to which the same considerations expressed in relation to the pillars 36 described with reference to FIG. 9 apply.

Then, the manufacturing process proceeds in the same way as described with reference to the embodiment shown in FIG. 9.

The advantages that the present manufacturing process affords emerge clearly from the foregoing description.

In particular, the present process envisages that the semiconductor body of the MEMS wafer 80 is machined in order to reduce the thickness and release the membranes, before carrying out coupling with the reconstructed wafer including the ASICs. In other words, the transduction structures are first singulated starting from the MEMS wafer, and are then coupled individually to the ASIC assembly 74; in this way, no bonding of a wafer-to-wafer type is carried out, with consequent reduction of the phenomenon of warpage, and no etching is carried out on the stack including the ASIC assembly 74 and the transduction structures 38.

Finally, it is clear that modifications and variations may be made to the manufacturing process described and illustrated herein, without thereby departing from the scope of the present disclosure, as defined in the annexed claims.

For instance, the preliminary contact elements 37A, 37B may have shapes different from what has been described; for example, even though it is not shown, each of them may include, in addition to the cylindrical portion discussed previously, a respective tip or blade portion, arranged on the cylindrical portion.

Instead of the bumps 18, 20 other conductive contact elements may be used, such as corresponding pillars. More in general, all the conductive contact elements described herein are provided purely by way of example.

Furthermore, it is possible to envisage formation of the preliminary contact elements 37A of the ASIC assembly 74, but not of the preliminary contact elements 37B of the MEMS wafer 80, in which case the preliminary contact elements 37A of the ASIC assembly 74 are bonded to the drive pads 50. Likewise, it is possible to envisage formation of the preliminary contact elements 37B of the MEMS wafer 80, but not of the preliminary contact elements 37A of the ASIC assembly 74, in which case the preliminary contact elements 37B of the MEMS wafer 80 are bonded to the outer pads 34.

Likewise, in the case of the embodiment shown in FIGS. 16-19, it is possible for the preliminary contact elements 37A of the ASIC assembly 74 not to be formed, in which case the pillars 336 are obtained by soldering the bumps 300 to the outer pads 34. Alternatively, it is possible for the preliminary contact elements 37A to be present, but not the bumps 300, in which case the preliminary contact elements 37A are set in contact with corresponding TSVs 302.

Moreover, each electroacoustic module may comprise a number of dice different from what is shown, in which case the manufacturing process is modified accordingly. The transmission and reception circuits may be formed in different dice. In this case, the transmission and reception circuits may be formed using different technologies.

In general, the actuators may be of a type different from what has been described. For instance, the actuators may implement an actuation mechanism of a capacitive type, instead of a piezoelectric type.

As mentioned previously, the thickness $W_{tot}$ of the ensemble formed by the multilayer region 39 and the semiconductor substrate 42 may also be less than 50 μm; example, the thickness $W_{tot}$ may be not more than 30 μm.

Embodiments of the type shown in FIGS. 16-19 are moreover possible, but in which, instead of the mask 402, buried dielectric regions are used of the type shown in FIG. 12, inside which the bumps 300 extend.

Finally, in the embodiments in which the buried dielectric regions 86 are present, grinding may be such that the latter are not exposed, but rather remain covered by a portion of semiconductor body 82, which is then removed during the subsequent etching operation.

A process for manufacturing electroacoustic modules (1), may be summarized as including forming an assembly (74) including a dielectric coating region (122); a plurality of unit portions (76) laterally staggered with respect to one another, each of which includes at least one respective die (2,4), arranged in the dielectric coating region (122); and a redistribution structure (126) electrically coupled to the dice (2, 4), the dielectric coating region (122) and the redistribution structure (126) being arranged on top of one another; said process may further includes forming a wafer (80) including a semiconductor body (82), having a thickness equal to an initial thickness ($W_{start}$), and a plurality of respective unit portions (84) laterally staggered with respect to one another, each of which includes a respective supporting region (39), arranged in contact with the semiconductor body (82), and a number of respective actuators (56), which contact the supporting region (39); reducing the thickness of the semiconductor body (82) of the wafer (80) to a final thickness (W$_{end}$); and then selectively removing portions of the semiconductor body (82), so as to singulate, starting from the wafer (80), a plurality of transduction structures (38; 338), each of which includes a respective semiconductor substrate (42), which contacts a corresponding supporting region (39) and is traversed by a number of respective cavities (52) delimited by corresponding portions of the supporting region (39), which form corresponding membranes (40) mechanically coupled to corresponding actuators (56); and then coupling the transduction structures (38; 338) to the redistribution structure (126) of the assembly (74).

Forming a wafer (80) may include forming a wafer cavity (90), which extends between the supporting regions (39) and moreover extends partially in the semiconductor body (82); and selectively removing portions of the semiconductor body (82) may include removing first portions of the semiconductor body (82), which contact corresponding portions of the supporting regions (39), so as to form said cavities (52), and removing second portions of the semiconductor body (82), which give out onto the wafer cavity (90), so as to singulate the transduction structures (38; 338).

After the reduction of thickness, the semiconductor body (82) may be delimited by a respective inner surface (S$_a$) and by a respective outer surface (S$_c$), the supporting regions (39) contacting the inner surface (S$_a$); said process may include forming a mask (202; 402) on the outer surface (S$_c$) of the semiconductor body (82) and removing said first and second portions of the semiconductor body (82) by performing an etch, through said mask (202).

The wafer (80) may include, for each respective unit portion (84), a corresponding buried dielectric region (86), which extends within the semiconductor body (82), said process may further include exposing the buried dielectric regions (86), by said reduction of the thickness of the semiconductor body (82) of the wafer (80); and then removing said first and second portions of the semiconductor body (82), using the buried dielectric regions (86) as mask.

The redistribution structure (126) may include a dielectric redistribution region (128), which may be delimited by a respective outer surface (S$_3$'), opposite to the dielectric coating region (122); and each unit portion (76) of the assembly (74) may further include a plurality of first pads (34), which give out onto the outer surface (S$_3$') of the dielectric redistribution region (128); and a plurality of conductive redistribution paths (30,32), which extend through the dielectric redistribution region (128) and electrically couple the first pads (34) to said at least one die (2,4); and the wafer (80) may include a plurality of second pads (50), arranged on the supporting regions (39) and electrically coupled to the actuators (56), said process may further include carrying out at least one step from between for each unit portion (76) of the assembly (74), forming a plurality of first conductive contact elements (37A), which extend from corresponding first pads (34), in an opposite direction with respect to the dielectric redistribution region (128); and for each unit portion (84) of the wafer (80), forming a plurality of second conductive contact elements (37B), which extend from corresponding second pads (50), in an opposite direction with respect to the semiconductor body (82); and coupling the transduction structures (38) to the redistribution structure (126) of the assembly (74) may include forming electrical contacts (36), which each extend between a corresponding first pad (34) and a corresponding second pad (50), by carrying out the steps of if the steps of forming the first and second conductive contact elements (37A, 37B) may be carried out, soldering each first conductive contact element (37A) to a corresponding second conductive contact element (37B); if the step of forming the first conductive contact elements (37A) may be carried out, but the step of forming the second conductive contact elements (37B) may not be carried out, soldering each first conductive contact element (37A) to a corresponding second pad (50); if the step of forming the second conductive contact elements (37B) may be carried out, but the step of forming the first conductive contact elements (37A) may not be carried out, soldering each second conductive contact element (37B) to a corresponding first pad (34).

The redistribution structure (126) may include a dielectric redistribution region (128), which may be delimited by a respective outer surface (S$_3$'), opposite to the dielectric coating region (122), each unit portion (76) of the assembly (74) may further include a plurality of first pads (34), which give out onto the outer surface (S$_3$') of the dielectric redistribution region (128); and a plurality of first conductive redistribution paths (30,32), which extend through the dielectric redistribution region (128) and electrically couple the first pads (34) to said at least one die (2,4); and, after the reduction of thickness, the semiconductor body (82) may be delimited by a respective inner surface (S$_a$) and by a respective outer surface (S$_c$), the supporting regions (39) contacting the inner surface (S$_a$); said process may further include forming a plurality of through-silicon vias (302), which extend through the semiconductor body (82), as far as the outer surface (S$_c$), and may be electrically coupled to the actuators (56), and carrying out at least one step from between for each unit portion (76) of the assembly (74), forming a plurality of first conductive contact elements (37A), which extend from corresponding first pads (34), in an opposite direction with respect to the dielectric redistribution region (128); and for each unit portion (84) of the wafer (80), forming on the outer surface (S$_c$) of the semiconductor body (82) a corresponding plurality of third conductive contact elements (300), each of which may be electrically coupled to a corresponding through-silicon via (302); and coupling the transduction structures (338) to the redistribution structure (126) of the assembly (74) may include forming, between each first pad (34) and a corresponding through-silicon via (302), a corresponding electrical contact (336), which includes the corresponding first conductive contact element (37A) and/or the third conductive contact element (300).

Coupling the transduction structures (38; 338) to the redistribution structure (126) of the assembly (74) may include arranging the transduction structures (38; 338) laterally staggered and separated by a gap (299; 399); said process may further include forming in the gap (299; 399) a bonding region (92), which laterally delimits, for each transduction structure (38; 338), a corresponding closed cavity (55), which may be moreover delimited by the corresponding supporting region (39) and by a corresponding portion of the dielectric redistribution region (128); and then carrying out a dicing operation, along scribe lines that traverse the bonding region (92).

Said initial thickness (W$_{start}$) may be at least equal to 400 µm, and the sum of said final thickness (W$_{end}$) and the thickness of the supporting regions (39) may not be greater than 50 µm.

Each supporting region (39) may include at least one dielectric layer (41*d*). The actuators (56) may be of a piezoelectric type.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:

forming an assembly including:
    forming a plurality of first unit portions laterally staggered with respect to one another by forming a dielectric coating region around a plurality of die, each respective first unit portion comprises at least one die, of the plurality of die arranged in the dielectric coating region; and
    forming a redistribution structure electrically coupled to the plurality of die of the plurality of first unit portions, the dielectric coating region being on the redistribution structure;

forming a wafer including a semiconductor body, having an initial thickness, and a plurality of second unit portions laterally staggered with respect to one another, each of which comprises a supporting region, arranged in contact with the semiconductor body, and a number of actuators, which contact the supporting region;

reducing the thickness of the semiconductor body of the wafer to a final thickness;

after reducing the thickness of the semiconductor body of the wafer to the final thickness, selectively removing portions of the semiconductor body, so as to singulate, starting from the wafer, a plurality of transduction structures, each of which includes a semiconductor substrate, which contacts a corresponding one of the supporting regions and is traversed by a number of cavities delimited by corresponding portions of the corresponding one of the supporting regions and by corresponding ones of a plurality of semiconductor portions formed by selectively removing the portions of the semiconductor body, which form corresponding membranes mechanically coupled to corresponding ones of the actuators, wherein selectively removing the portions of the semiconductor body comprises removing the portions of the semiconductor body that contact corresponding portions of the supporting regions so as to form the number of cavities; and after selectively removing the portions of the semiconductor body of the wafer forming the number of cavities, coupling the transduction structures to the redistribution structure of the assembly.

2. The method according to claim 1, wherein:

forming the wafer comprises forming a wafer cavity, which extends between the supporting regions and moreover extends partially into the semiconductor body; and selectively removing the portions of the semiconductor body comprises removing first portions of the semiconductor body, which contact corresponding portions of the supporting regions, so as to form the cavities, and removing second portions of the semiconductor body, which are aligned with the wafer cavity, so as to singulate the transduction structures.

3. The method according to claim 2, wherein, after the reduction of thickness, the semiconductor body is delimited by a first surface and by a second surface, the supporting regions contacting the first surface.

4. The method according to claim 3, further comprising forming a mask on the second surface of the semiconductor body and removing the first and second portions of the semiconductor body by performing an etching through the mask.

5. The method according to claim 2, wherein the wafer comprises, for each second unit portion of the plurality of second unit portions, a corresponding buried dielectric region, which extends within the semiconductor body, the method further comprising:

exposing the buried dielectric regions, by said reduction of the thickness of the semiconductor body of the wafer; and removing said first and second portions of the semiconductor body, using the buried dielectric regions as a mask.

6. The method according to claim 2, wherein:

forming the redistribution structure comprises forming a dielectric redistribution region, which is delimited by a respective outer surface opposite to the dielectric coating region, forming each first unit portion of the plurality of first unit portions of the assembly further includes:

forming a plurality of first pads, which are exposed from the outer surface of the dielectric redistribution region; and forming a plurality of first conductive redistribution paths, which extend through the dielectric redistribution region and electrically couple the first pads to the at least one die; and after the reduction of thickness, the semiconductor body is delimited by a respective inner surface and by a respective outer surface, the supporting regions contacting the inner surface.

7. The method according to claim 1, wherein:

forming the redistribution structure includes forming a dielectric redistribution region, which is delimited by a surface, opposite to the dielectric coating region;

forming each first unit portion of the plurality of first unit portions of the assembly further comprises:

forming a plurality of first pads, which are exposed at the surface of the dielectric redistribution region; and forming a plurality of conductive redistribution paths, which extend through the dielectric redistribution region and electrically couple the first pads to the at least one die;

forming the wafer includes forming a plurality of second pads, arranged on the supporting regions and electrically coupled to the actuators.

8. The method of claim 7, wherein forming each first unit portion of the plurality of first unit portions of the assembly includes forming a plurality of first conductive contact elements, which extend from corresponding ones of the plurality of first pads, in an opposite direction with respect to the dielectric redistribution region.

9. The method of claim 8, wherein forming the wafer includes forming a plurality of second conductive contact elements, which extend from corresponding ones of the plurality of second pads, in an opposite direction with respect to the semiconductor body.

10. The method of claim 9, wherein coupling the transduction structures to the redistribution structure of the assembly comprises forming electrical contacts, which each extend between a corresponding one of the plurality of first pads and a corresponding one of the plurality of second pads, by coupling each one of the plurality of first conductive contact elements to a corresponding one of the plurality of second conductive contact elements.

11. The method of claim 9, further comprising:
forming in a gap, a bonding region, which laterally delimits, for each transduction structure, a corresponding closed cavity, which is moreover delimited by the corresponding supporting region and by a corresponding portion of the dielectric redistribution region; and
carrying out a dicing operation, along scribe lines that traverse the bonding region.

12. The method of claim 8, further comprising coupling each one of the plurality of first conductive contact elements to a corresponding one of the plurality of second pads.

13. The method of claim 7, further comprising:
forming a plurality of first conductive contact elements of the wafer, which extend from ones of the plurality of second pads, in an opposite direction with respect to the semiconductor body; and
coupling each one of the plurality of second pads to a corresponding one of the plurality of first pads with the plurality of first conductive elements.

14. A method, comprising:
forming a plurality of unit portions of an assembly including:
coupling a plurality of die to a redistribution structure;
forming a coating region on the redistribution structure and enclosing the plurality of die; and
forming a connection region extending through the coating region to the redistribution structure;
forming a wafer including:
forming a multilayer structure on a surface of a semiconductor body;
forming a plurality of actuators on the multilayer structure;
forming a plurality of drive pads on the multilayer structure;
forming a plurality of connection elements on the plurality of drive pads;
forming a plurality of first recesses extending through the multilayer structure and extending into a first surface of the semiconductor body; and
forming a plurality of second recesses extending into a second surface of the semiconductor body opposite to the first surface and extending to the multilayer structure;
forming a plurality of transduction structures by singulating the wafer;
coupling the plurality of transduction structures to the assembly by coupling the plurality of connection elements of the plurality of transduction structures to the redistribution structure;
forming a bonding region between adjacent ones of the plurality of transduction structures; and
forming a plurality of die assemblies by singulating the bonding region and the assembly.

15. The method of claim 14, wherein coupling the transduction structures to the assembly further includes overlapping ones of the plurality of units portions with the plurality of actuators of the plurality of transduction structures.

16. A method, comprising:
forming a plurality of unit portions of an assembly including:
coupling a plurality of die to a redistribution structure;
forming a coating region on the redistribution structure and enclosing the plurality of die; and
forming a connection region extending through the coating region to the redistribution structure;
forming a wafer including:
forming a plurality of actuators;
forming a plurality of drive pads;
forming a plurality of connection elements on the plurality of drive pads;
forming a plurality of recesses extending into a first surface of a semiconductor body; and
forming a plurality of second recesses extending into a second surface of the semiconductor body opposite to the first surface;
forming a pair of transduction structures by singulating the wafer;
coupling the pair of transduction structures to the assembly including coupling a plurality of connection elements of a first transduction structure of the pair of transduction structures to the redistribution structure, coupling a plurality of connection elements of a second transduction structure of the pair of transduction structures, and defining a gap between the first transduction structure of the pair of transduction structures and the second transduction structure of the pair of transduction structures; and
forming a bonding region between the first transduction structure and the second transduction structure, the bonding region extends from the first transduction structure to the second transduction structure, the bonding region extends from the first transduction structure to the redistribution structure, and the bonding region extends from the second transduction structure to the redistribution structure.

17. The method of claim 16, wherein:
forming the wafer further includes forming a multilayer structure on the first surface of the semiconductor body;
forming the plurality of actuators further includes forming the plurality of actuators on the multilayer structure;
forming the plurality of drive pads further includes forming the plurality of drive pads on the multilayer structure;
forming the plurality of first recesses further includes forming the plurality of first recesses extending through the multilayer structure and extending into the first surface of the semiconductor body; and
forming the plurality of second recesses further includes forming the plurality of second recesses extending into the second surface of the semiconductor body and extending to the multilayer structure.

18. The method of claim 17, wherein forming the bonding region further includes the bonding region extending from a first multilayer structure of the first transduction structure of the pair of transduction structure to a second multilayer structure of the second transduction structure of the pair of transduction structures.

19. The method of claim 18, wherein the bonding region extends from the first multilayer structure to the redistribution structure and the bonding region extends from the second multilayer structure to the redistribution structure.

* * * * *